United States Patent
Preil et al.

(10) Patent No.: US 8,644,588 B2
(45) Date of Patent: Feb. 4, 2014

(54) PHOTO-MASK AND WAFER IMAGE RECONSTRUCTION

(75) Inventors: Moshe E. Preil, Sunnyvale, CA (US); Alex N. Hegyi, Ann Arbor, MI (US); Daniel S. Abrams, Palo Alto, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 1036 days.

(21) Appl. No.: 12/440,722

(22) PCT Filed: Sep. 19, 2007

(86) PCT No.: PCT/US2007/078913
§ 371 (c)(1),
(2), (4) Date: Feb. 5, 2010

(87) PCT Pub. No.: WO2008/039674
PCT Pub. Date: Apr. 3, 2008

(65) Prior Publication Data
US 2010/0135568 A1    Jun. 3, 2010

Related U.S. Application Data

(60) Provisional application No. 60/826,294, filed on Sep. 20, 2006.

(51) Int. Cl.
*G06K 9/00*    (2006.01)
(52) U.S. Cl.
USPC .......... 382/144; 356/3.01; 382/145; 382/218; 430/5
(58) Field of Classification Search
USPC .................. 356/3.01; 382/141, 144, 145, 219; 430/5
See application file for complete search history.

(56) References Cited

U.S. PATENT DOCUMENTS

| | | | |
|---|---|---|---|
| 5,640,199 A | 6/1997 | Garakani et al. | |
| 6,025,905 A * | 2/2000 | Sussman | 356/3.01 |
| 6,042,998 A | 3/2000 | Brueck et al. | |
| 6,235,434 B1 | 5/2001 | Sweeney et al. | |
| 6,484,306 B1 | 11/2002 | Bokor et al. | |
| 6,563,566 B2 | 5/2003 | Rosenbluth et al. | |
| 6,787,274 B2 * | 9/2004 | Park | 430/5 |

(Continued)

FOREIGN PATENT DOCUMENTS

| WO | WO 2005/078528 A2 | 8/2005 |
|---|---|---|
| WO | WO 2005/078528 A3 | 8/2005 |
| WO | WO 2008/039674 A2 | 4/2008 |
| WO | WO 2008/039674 A3 | 4/2008 |

OTHER PUBLICATIONS

Notice of Allowance issued by U.S. Patent and Trademark Office, mailed Nov. 14, 2011, in Preil, Moshe E. et al., U.S. Appl. No. 12/475,331, "Photo-Mask and Wafer Image Reconstruction" filed May 29, 2009.

(Continued)

*Primary Examiner* — Gregory M Desire
(74) *Attorney, Agent, or Firm* — Wilson Sonsini Goodrich & Rosati

(57) ABSTRACT

A system receives a mask pattern and a first image of at least a portion of a photo-mask corresponding to the mask pattern. The system determines a second image of at least the portion of the photo-mask based on the first image and the mask pattern. This second image is characterized by additional spatial frequencies than the first image.

29 Claims, 13 Drawing Sheets

(56) References Cited

U.S. PATENT DOCUMENTS

| | | | |
|---|---|---|---|
| 6,871,337 B2 | 3/2005 | Socha | |
| 7,057,709 B2 | 6/2006 | Rosenbluth | |
| 7,073,162 B2 | 7/2006 | Cobb et al. | |
| 7,107,573 B2 | 9/2006 | Yamazoe et al. | |
| 7,124,394 B1 | 10/2006 | Abrams et al. | |
| 7,178,127 B2 | 2/2007 | Abrams et al. | |
| 7,231,628 B2 | 6/2007 | Pack et al. | |
| 7,302,090 B2 | 11/2007 | Kalus et al. | |
| 7,363,611 B2 | 4/2008 | Rosenbluth | |
| 7,376,512 B2 | 5/2008 | Hirscher et al. | |
| 7,441,227 B2 | 10/2008 | Abrams et al. | |
| 7,454,051 B2 * | 11/2008 | Hirano et al. | 382/144 |
| 7,475,383 B2 * | 1/2009 | Suh et al. | 716/54 |
| 7,480,889 B2 | 1/2009 | Abrams et al. | |
| 7,557,921 B1 | 7/2009 | Adel et al. | |
| 7,560,198 B2 * | 7/2009 | Jang et al. | 430/5 |
| 7,571,423 B2 | 8/2009 | Abrams et al. | |
| 7,646,906 B2 | 1/2010 | Saidin et al. | |
| 7,689,966 B2 | 3/2010 | Verma et al. | |
| 7,695,876 B2 | 4/2010 | Ye et al. | |
| 7,698,665 B2 | 4/2010 | Abrams et al. | |
| 7,703,049 B2 | 4/2010 | Abrams et al. | |
| 7,703,068 B2 | 4/2010 | Abrams et al. | |
| 7,707,541 B2 | 4/2010 | Abrams et al. | |
| 7,749,666 B2 | 7/2010 | Gassner et al. | |
| 7,757,201 B2 | 7/2010 | Abrams et al. | |
| 7,769,225 B2 | 8/2010 | Kekare et al. | |
| 7,805,700 B2 | 9/2010 | Peng | |
| 7,853,920 B2 | 12/2010 | Preil et al. | |
| 7,921,383 B1 | 4/2011 | Wei | |
| 7,984,391 B2 | 7/2011 | Abrams et al. | |
| 7,992,109 B2 | 8/2011 | Abrams et al. | |
| 7,995,832 B2 | 8/2011 | Xiong et al. | |
| 8,056,021 B2 | 11/2011 | Abrams et al. | |
| 8,057,967 B2 | 11/2011 | Ye et al. | |
| 8,200,002 B2 | 6/2012 | Preil et al. | |
| 8,204,295 B2 | 6/2012 | Preil et al. | |
| 8,208,712 B2 | 6/2012 | Preil et al. | |
| 8,260,032 B2 | 9/2012 | Preil et al. | |
| 8,280,146 B2 | 10/2012 | Preil et al. | |
| 8,331,645 B2 | 12/2012 | Preil et al. | |
| 8,386,968 B2 | 2/2013 | Pang | |
| 8,458,622 B2 | 6/2013 | Pang et al. | |
| 8,463,016 B2 | 6/2013 | Pang | |
| 2002/0192578 A1 | 12/2002 | Tanaka et al. | |
| 2003/0103189 A1 | 6/2003 | Neureuther et al. | |
| 2003/0106642 A1 | 6/2003 | Fairbairn et al. | |
| 2004/0008880 A1 | 1/2004 | Horie et al. | |
| 2004/0265707 A1 * | 12/2004 | Socha | 430/5 |
| 2005/0122500 A1 | 6/2005 | Ye et al. | |
| 2005/0168498 A1 | 8/2005 | Granik | |
| 2006/0048089 A1 | 3/2006 | Schwarzband | |
| 2006/0051682 A1 | 3/2006 | Hess et al. | |
| 2006/0062445 A1 | 3/2006 | Verma et al. | |
| 2006/0187451 A1 * | 8/2006 | McIntyre et al. | 356/364 |
| 2006/0273242 A1 | 12/2006 | Hunsche et al. | |
| 2007/0133862 A1 | 6/2007 | Gold et al. | |
| 2007/0198963 A1 | 8/2007 | Granik et al. | |
| 2008/0068569 A1 * | 3/2008 | Mulckhuyse et al. | 355/53 |
| 2008/0152212 A1 | 6/2008 | Feldman | |
| 2008/0186466 A1 * | 8/2008 | Sirat et al. | 355/55 |
| 2010/0021042 A1 | 1/2010 | Preil et al. | |
| 2010/0021043 A1 | 1/2010 | Preil et al. | |
| 2010/0021824 A1 | 1/2010 | Preil et al. | |
| 2010/0080443 A1 | 4/2010 | Preil et al. | |
| 2010/0086195 A1 | 4/2010 | Preil et al. | |
| 2010/0119143 A1 | 5/2010 | Preil et al. | |
| 2010/0135568 A1 * | 6/2010 | Preil et al. | 382/144 |
| 2010/0225894 A1 * | 9/2010 | Ferren et al. | 355/71 |

OTHER PUBLICATIONS

Request for Continued Examination filed Feb. 13, 2012 in Preil, Moshe E., et al. U.S. Appl. No. 12/475,331, "Photo-Mask and Wafer Image Reconstruction" filed May 29, 2009.

Amendment filed Feb. 13, 2012 in Preil, Moshe E., et al. U.S. Appl. No. 12/475,331, "Photo-Mask and Wafer Image Reconstruction" filed May 29, 2009.

Office Action issued by U.S. Patent and Trademark Office, mailed Oct. 25, 2011, in Preil, Moshe E. et al., U.S. Appl. No. 12/475,338, "Photo-Mask and Wafer Image Reconstruction" filed May 29, 2009.

Response to Office Action filed Feb. 14, 2012, in Preil, Moshe E. et al., U.S. Appl. No. 12/475,338, "Photo-Mask and Wafer Image Reconstruction" filed May 29, 2009.

Petition Under C.F.R. § 1.78(A)(6) to Accept an Unintentionally Delayed Claim Under 35 U.S.C § 119(E) for the Benefit of a Prior Provisional Application filed Feb. 14, 2012 in Preil, Moshe E. et al., U.S. Appl. No. 12/475,338, "Photo-Mask and Wafer Image Reconstruction" filed May 29, 2009.

Office Action issued by U.S. Patent and Trademark Office, mailed Oct. 24, 2011, in Preil, Moshe E. et al., U.S. Appl. No. 12/475,349, "Photo-Mask and Wafer Image Reconstruction" filed May 29, 2009.

Response to Office Action filed Feb. 14, 2012, in Preil, Moshe E. et al., U.S. Appl. No. 12/475,349, "Photo-Mask and Wafer Image Reconstruction" filed May 29, 2009.

Petition Under C.F.R. § 1.78(A)(6) to Accept an Unintentionally Delayed Claim Under 35 U.S.C § 119(E) for the Benefit of a Prior Provisional Application filed Feb. 14, 2012 in Preil, Moshe E. et al., U.S. Appl. No. 12/475,349, "Photo-Mask and Wafer Image Reconstruction" filed May 29, 2009.

Office Action issued by U.S. Patent and Trademark Office, mailed Nov. 9, 2011, in Preil, Moshe E. et al., U.S. Appl. No. 12/475,354, "Photo-Mask and Wafer Image Reconstruction" filed May 29, 2009.

Response to Office Action filed Feb. 15, 2012, in Preil, Moshe E. et al., U.S. Appl. No. 12/475,354, "Photo-Mask and Wafer Image Reconstruction" filed May 29, 2009.

Office Action issued by U.S. Patent and Trademark Office, mailed Oct. 24, 2011, in Preil, Moshe E. et al., U.S. Appl. No. 12/475,361, "Photo-Mask and Wafer Image Reconstruction" filed May 29, 2009.

Response to Office Action filed Feb. 15, 2012, in Preil, Moshe E. et al., U.S. Appl. No. 12/475,361, "Photo-Mask and Wafer Image Reconstruction" filed May 29, 2009.

Office Action issued by U.S. Patent and Trademark Office, mailed Nov. 16, 2011, in Preil, Moshe E. et al., U.S. Appl. No. 12/475,369, "Photo-Mask and Wafer Image Reconstruction" filed May 29, 2009.

Response to Office Action filed Feb. 15, 2012, in Preil, Moshe E. et al., U.S. Appl. No. 12/475,369, "Photo-Mask and Wafer Image Reconstruction" filed May 29, 2009.

Petition Under C.F.R. § 1.78(A)(6) to Accept an Unintentionally Delayed Claim Under 35 U.S.C § 119(E) for the Benefit of a Prior Provisional Application filed Feb. 13, 2012, Preil, Moshe E. et al., U.S. Appl. No. 12/440,722, "Photo-Mask and Wafer Image Reconstruction" filed Feb. 5, 2010.

Written Opinion issued by U.S. Patent and Trademark Office, mailed Mar. 25, 2008, in Luminescent Technologies, Inc. International Application No. PCT/US07/078913, "Photo-Mask and Wafer Image Reconstruction" filing date Sep. 19, 2007.

Response to Written Opinion filed Jul. 17, 2008, in Luminescent Technologies, Inc. International Application No. PCT/US07/078913, "Photo-Mask and Wafer Image Reconstruction" filing date Sep. 19, 2007.

Notice of Allowance issued by U.S. Patent and Trademark Office, mailed May 4, 2012, in Preil, Moshe E. et al., U.S. Appl. No. 12/475,338, "Photo-Mask and Wafer Image Reconstruction" filed May 29, 2009.

Office Action issued by U.S. Patent and Trademark Office, mailed Mar. 9, 2012, in Preil, Moshe E. et al., U.S. Appl. No. 12/475,361, "Photo-Mask and Wafer Image Reconstruction" filed May 29, 2009.

Response to Office Action filed Jul. 9, 2012, in Preil, Moshe E. et al., U.S. Appl. No. 12/475,361, "Photo-Mask and Wafer Image Reconstruction" filed May 29, 2009.

Clifford, C. H., "Technique for Analyzing a Reflective Photo-Mask," U.S. Appl. No. 13/021,591, filed Feb. 4, 2011.

Pang, L., "Technique for Analyzing a Reflective Photo-Mask," U.S. Appl. No. 13/024,233, filed Feb. 9, 2011.

Pang, L., "Virtual Photo-Mask Critical-Dimension Measurement," U.S. Appl. No. 12/955,617, filed Nov. 29, 2010.

(56) References Cited

OTHER PUBLICATIONS

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.

Pang, L. et al., "Computational Lithography & Inspection (CLI) and its Applications in Mask Inspection, Metrology, Review, and Repair," Luminescent Technologies Inc., Palo Alto, CA, Sep. 28, 2010.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

Notice of Allowance issued by USPTO, mailed Oct. 2, 2012, in Clifford, C., U.S. Appl. No. 13/021,591, "Technique for Analyzing a Reflective Photo-Mask" filed Feb. 4, 2011.

Request for Continued Examination filed, Oct. 31, 2012, in Clifford, C., U.S. Appl. No. 13/021,591, "Technique for Analyzing a Reflective Photo-Mask" filed Feb. 4, 2011.

Notice of Allowance issued by U.S. Patent and Trademark Office, mailed May 31, 2013, in Clifford, C., U.S. Appl. No. 13/021,591, "Technique for Analyzing a Reflective Photo-Mask" filed Feb. 4, 2011.

Preliminary Amendment filed Jul. 11, 2012, in Pang, et al., U.S. Appl. No. 13/024,233, "Technique for Repairing a Reflective Photo-Mask" filed Feb. 9, 2011.

Office Action issued by USPTO, mailed Oct. 2, 2012, in Pang, et al., U.S. Appl. No. 13/024,233, "Technique for Repairing a Reflective Photo-Mask" filed Feb. 9, 2011.

Response to Office Action filed Feb. 4, 2013, in Pang, et al., U.S. Appl. No. 13/024,233, "Technique for Repairing a Reflective Photo-Mask" filed Feb. 9, 2011.

Office Action issued by USPTO, mailed Apr. 5, 2013, in Pang, et al., U.S. Appl. No. 13/024,233, "Technique for Repairing a Reflective Photo-Mask" filed Feb. 9, 2011.

Response to Office Action filed Jun. 26, 2013, in Pang, et al., U.S. Appl. No. 13/024,233, "Technique for Repairing a Reflective Photo-Mask" filed Feb. 9, 2011.

Notice of Allowance issued by USPTO, mailed Aug. 2, 2013, in Pang, et al., U.S. Appl. No. 13/024,233, "Technique for Repairing a Reflective Photo-Mask" filed Feb. 9, 2011.

Satake, et al., "Technique for Repairing a Reflective Photo-Mask," U.S. Appl. No. 13/764,517, filed Feb. 11, 2013.

* cited by examiner

1000 — IMAGE 1010-1, IMAGE 1010-2, ... — FOCAL PLANE 1012-1, WAVELENGTH 1014-1, MAGNITUDE 1016-1, PHASE 1018-1

FIG. 11

1100 — DEFECT 1110-1, DEFECT 1110-2, ... — CHARACTERISTICS 1112-1, PROBABILITY 1114-1

PHOTO-MASK AND WAFER IMAGE RECONSTRUCTION

This application is a U.S. national phase application under 35 U.S.C. §371 of International Patent Application No. PCT/US07/78913, filed Sep. 19, 2007, and claims the benefit of U.S. Provisional Patent Application No. 60/826,294, filed Sep. 20, 2006.

BACKGROUND

1. Field of the Invention

The present invention relates to techniques for processing images. More specifically, the invention relates to reconstruction of photo-mask and wafer images.

2. Related Art

Photolithography is a widely used technology for producing integrated circuits. In) this technique, a light source illuminates a photo-mask. The resulting spatially varying light pattern is projected on to a photoresist layer on a semiconductor wafer by an optical system (referred to as an exposure tool). By developing the 3-dimensional pattern produced in this photoresist layer, a layer in the integrated circuit is created. Furthermore, since there are often multiple layers in a typical integrated circuit, these operations may be repeated using several photo-masks to produce a product wafer.

Unfortunately, as dimensions in integrated circuits steadily become a smaller fraction of the wavelength of the light used to expose images of the photo-mask onto the wafer, the structures in or on the ideal photo-mask (also referred to as the mask pattern) and/or the physical structures in or on the actual photo-mask bear less and less resemblance to the desired or) target pattern at the wafer. These differences between the mask pattern and the target pattern are used to compensate for the diffraction and proximity effects that occur when light is transmitted through the optics of the exposure tool and is converted into the 3-dimensional pattern in the photoresist.

From a photo-mask or reticle manufacturing standpoint, the increasing dissimilarity between the photo-mask and the corresponding wafer patterns creates a broad new class of problems in photo-mask inspection and qualification. For example, if a defect in a photo-mask is detected, it is often unclear what impact this defect will have on the final pattern in the photoresist. In addition, photo-mask inspection devices often have a different numerical aperture, different illumination configuration, and even different light wavelength(s) than those used in the wafer exposure tool. As a consequence, the image measured by a photo-mask inspection tool is often neither a perfect replica of the physical photo-mask or the pattern that will be exposed onto the wafer.

One existing approach to the former challenge uses a computer to simulate the resulting wafer pattern based on the inspection images of the photo-mask. By comparing simulations of wafer patterns corresponding to the ideal photo-mask (i.e., the target mask pattern) and an estimate of the actual photo-mask corresponding to the image of the photo-mask, the significance of the defect may be determined. However, since the image of the photo-mask may not be an accurate representation of the actual photo-mask, errors may be introduced when simulating wafer patterns, and thus, when trying to identify or classify defects. This may further complicate photo-mask inspection and qualification.

Similar issues arise when inspecting the patterned wafers. Hence, what is needed are photo-mask and patterned wafer inspection techniques that overcome the problems listed above.

SUMMARY

One embodiment of the present invention provides a computer system for determining an image. The system receives a mask pattern and a first image of at least a portion of a photo-mask corresponding to the mask pattern. The system determines a second image of at least the portion of the photo-mask based on the first image and the mask pattern. This second image is characterized by additional spatial frequencies than the first image.

In some embodiments, the mask pattern is characterized by spatial frequencies within a first band of frequencies, the first image is characterized by spatial frequencies within a second band of frequencies that is less than the first band of frequencies, and the second image is characterized by spatial frequencies within a third band of frequencies that is greater than the second band of frequencies. The third band of frequencies may approximately include the first) band of frequencies.

In some embodiments, the system identifies features in the second image corresponding to differences between at least the portion of the photo-mask and the mask pattern (such as defects in the photo-mask). Furthermore, the system may determine an acceptance condition of the photo-mask based on at least a subset of the features and/or a number of the features in at least the subset of the features.

In some embodiments, at least the subset of the features is identified by the system based on an estimated pattern that results from a photolithographic process using an estimated photo-mask that corresponds to the second image. The estimated pattern may be calculated using a model of an optical path used in the photolithographic process. For example, the model of the optical path may include a forward optical calculation in which the estimated photo-mask is included in an object plane to determine the estimated pattern. In addition, the estimated pattern may be calculated using a model of a photoresist used in the photolithographic process. And in some embodiments, at least the subset of the features may be further identified by the system based on differences between the estimated pattern and a target pattern that corresponds to at least a portion of an integrated circuit.

In some embodiments, the acceptance condition of the photo-mask is based on a process window corresponding to the estimated photo-mask and/or based on features identified throughout the process window.

In some embodiments, at least the subset of the features is identified based on a set of pre-determined features and/or statistical properties of the set of pre-determined features. Furthermore, in some embodiments the system provides a ranking of at least the subset of the features.

In some embodiments, the system iteratively performs the operations of determining the second images and identifying the features, where at least the subset of the features identified have a likelihood of occurrence exceeding a pre-determined value.

In some embodiments, the second image is determined using an inverse optical calculation in which the first image is in an image plane of a model of an optical path that corresponds to an optical inspection device used to generate the first image and the second image is in an object plane of the model of the optical path.

In some embodiments, the second image is further determined based on a third image of the photo-mask, where the first image and the third image correspond to different focal surfaces in the optical inspection device. Furthermore, the second image may be determined based on weights for the first image and the third image, and/or the first image and the third image may include magnitude and phase information.

In another embodiment, the system receives the mask pattern and the first image. The system determines the second image based on the first image and the mask pattern in an optical calculation that uses the model of the optical path corresponding to the optical inspection device in which the first image is included in an image plane and the second image is included in an object plane. This second image is characterized by additional spatial frequencies than the first image.

The determining may include an iterative calculation and/or may be in accordance with a gradient descent calculation (for example, using a steepest descent technique).

In yet another embodiment, the system receives a target pattern and a fourth image of at least the portion of a patterned wafer corresponding to the target pattern. The system determines a fifth image of at least the portion of the patterned wafer based on the fourth image and the target pattern. This fifth image is characterized by additional spatial frequencies than the fourth image.

Another embodiment provides a method including at least some of the above-described operations.

Another embodiment provides a computer program product for use in conjunction with the computer system.

BRIEF DESCRIPTION OF THE FIGURES

FIG. 10 is a block diagram illustrating an image data structure in accordance with an embodiment of the present invention.

FIG. 11 is a block diagram illustrating a feature data structure in accordance with an embodiment of the present invention.

Note that like reference numerals refer to corresponding parts throughout the drawings.

DETAILED DESCRIPTION

Figure 1:
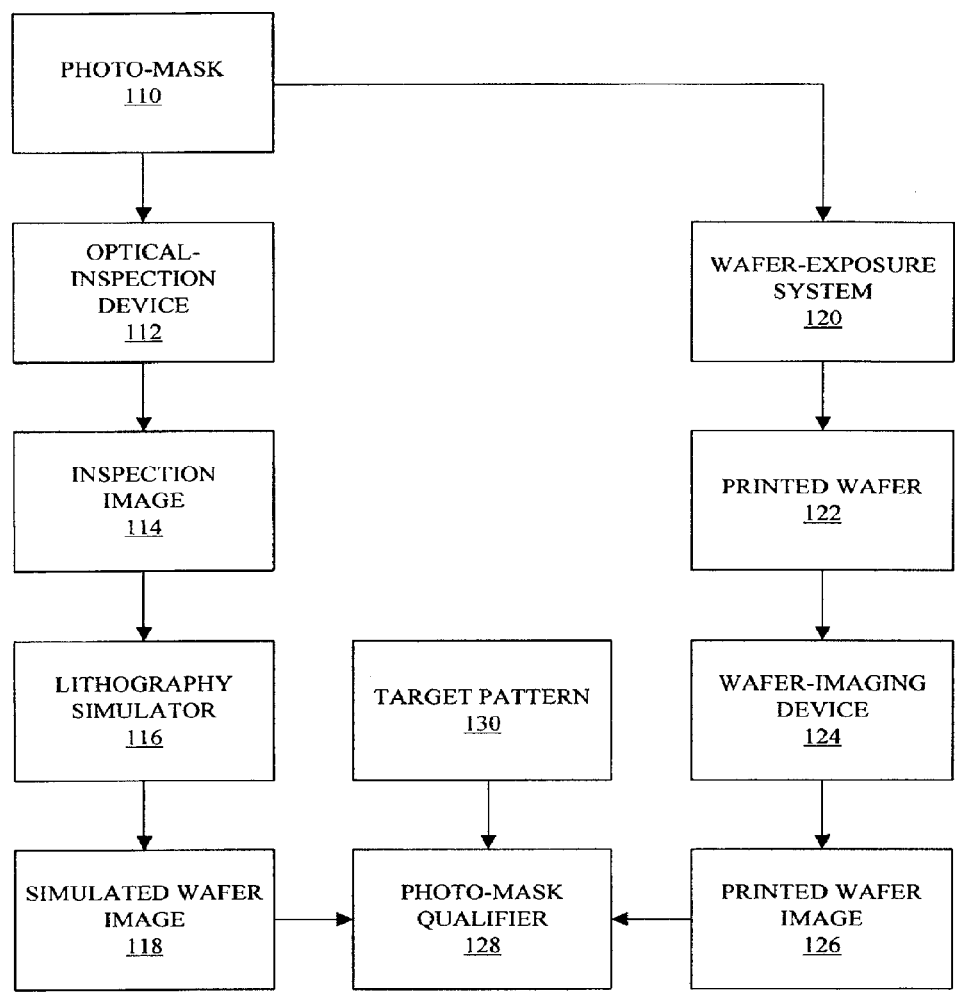
FIG. 1 is a block diagram illustrating an existing photo-mask inspection system.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software) for use with the computer system are described. These devices and processes may be used to determine an image, such as one corresponding to a photo-mask or a patterned wafer. In particular, an initial image of the photo-mask or patterned wafer that is obtained using a photo-mask or wafer optical-inspection device may be processed to determine a final image. Note that in some embodiments, at least two initial images are used to determine the final image. These images may be measured at different wavelengths and/or on different focal surfaces in the photo-mask or wafer optical-inspection device. More generally, these images may be determined at different imaging conditions (including focus, wavelength, illumination type, and/or measurement technique). In addition, each of these images may include magnitude and phase information. In one embodiment, the determining includes an optical calculation that uses a model of the optical path in the photo-mask or wafer optical-inspection device in which the initial image is included in an image plane (such as the focal plane) and the final image is included in an object plane.

The final image may correct the initial image for artifacts due to focal errors and/or optical aberrations associated with the optical path in the photo-mask or wafer optical-inspection device. In addition, the final image may recover information about the photo-mask or patterned wafer that was corrupted, distorted, and/or absent in the initial image. For example, the final image may include information (including magnitude and/or phase information) at spatial frequencies that were not present in the initial image due to a finite numerical aperture of the optical path and/or other limitations in the photo-mask or wafer optical-inspection device. For images of the photo-mask, such image processing may be based on at least a portion of the desired or target mask pattern. And for images of the patterned wafer, the image processing may be based on the at least a portion of a desired or target pattern, which may correspond to at least a portion of an integrated circuit (such as a physical layout of at least the portion of the integrated circuit). Note that this target pattern and/or the target mask pattern may correspond to a document that is compatible with Graphic Design System II (GDSII) and/or OASIS format.

In some embodiments, additional simulations and/or measurements are used to determine wafer patterns that correspond to the photo-mask. For example, an estimated wafer pattern (also referred to as a simulated wafer image) that results from a photolithographic process that uses an estimated photo-mask corresponding to the final image may be calculated. Note that the estimated photo-mask may be determined by applying one or more thresholds to the final image. Furthermore, this estimated wafer pattern may be compared to the target pattern, another estimated wafer pattern that is determined using the (target) mask pattern, and/or a measured pattern on a patterned wafer that is produced using the photo-mask.

Furthermore, features in the final image may be identified. For images of the photo-mask, these features may correspond to differences between at least the portion of the photo-mask and the mask pattern (for example, due to defects in and/or on the photo-mask). And for images of the patterned wafer, these features may correspond to differences between the pattern on the wafer and the target pattern (for example, due to defects in and/or on the wafer). The photo-mask and/or the wafer may be accepted or rejected based on at least a subset of the features.

This image processing approach may be implemented as a stand-alone software application, or as a program module or subroutine in another application, such as photo-mask and/or wafer inspection software. Furthermore, the software may be configured to execute on a client or local computer, such as a personal computer, a laptop computer, or other device capable of manipulating computer readable data, or between two or more computing systems over a network (such as the Internet, World Wide Web or WWW, Intranet, LAN, WAN, MAN, or combination of networks, or other technology enabling communication between computing systems). Therefore, information to be used when determining images may be stored locally (for example, on the local computer) and/or remotely (for example, on a computer or server that is accessed via a network).

We now describe embodiments of a computer system, a method, and software for determining an image. FIG. 1 provides a block diagram illustrating an existing photo-mask inspection system 100. In the photo-mask inspection system 100, an optical-inspection device 112 (such as the TeraScan™ photo-mask inspection system from KLA-Tencor, Inc., of San Jose, Calif.) determines an inspection image 114 of a photo-mask 110. Note that throughout the following discussion the inspection image 114, as well as any of the other images (such as reconstructed images) and/or patterns (such as mask patterns) described below, may be a bitmap or grayscale file that includes a set of values corresponding to pixels in an image. Furthermore, the quantization (i.e., the number of bits) in these image files may be varied, as needed, during the calculations that are described. Alternative formats having the same or similar information content, including a vector-based format such as GDSII, may be used in some embodiments of the images and/or patterns. And in some embodiments, the images include real and imaginary components (or equivalently, magnitude and phase information).

Using a lithography simulator 116, a simulated or estimated wafer image 118 (i.e., an image of an estimated pattern that may be produced using an estimated photo-mask that corresponds to the inspection image 114) may be determined. Furthermore, photo-mask qualifier 128 may analyze the simulated wafer image 118 to determine if it is acceptable, i.e., if differences with respect to a target pattern 130 and/or any defects that are present are within acceptable bounds, such as a fraction of a critical dimension in the target pattern. (Note that the target pattern 130 may correspond to at least a portion of an integrated circuit.) If yes, the photo-mask 110 may be accepted, and if not the photo-mask 110 may be rejected, subject to rework, or subject to additional qualification testing.

However, as noted previously, limitations in the optical-inspection device 112 result in differences between the estimated photo-mask that corresponds to the inspection image 114 and the photo-mask 110. As a consequence, analysis of the simulated wafer image 118 may not be sufficient to determine if there are defects in the photo-mask 110 and/or if defects that are detected are significant. Thus, the limitations of the optical-inspection device 112 may gate the ability to qualify photo-masks, and may impact photo-mask and/or patterned wafer yields.

Alternatively, the photo-mask 110 may be qualified based on comparisons between the simulated wafer image 118 or the target pattern 130 and actual wafer patterns produced or generated using the photo-mask 110. For example, a wafer-exposure system 120 (i.e., a photolithographic exposure tool) may be used to produce a printed wafer 122 using the photo-mask 110, and a printed wafer image 126 of the pattern on the printed wafer 122 may be determined using wafer-imaging device 124 (such as the PUMA™ patterned wafer-inspection platform from KLA-Tencor, Inc., of San Jose, Calif.). However, this brute-force approach is often expensive and time consuming. In addition, errors introduced in the photolithographic process in the wafer-exposure system 120 may reduce the accuracy of the qualification decision made by the photo-mask qualifier 128.

Figure 2A:
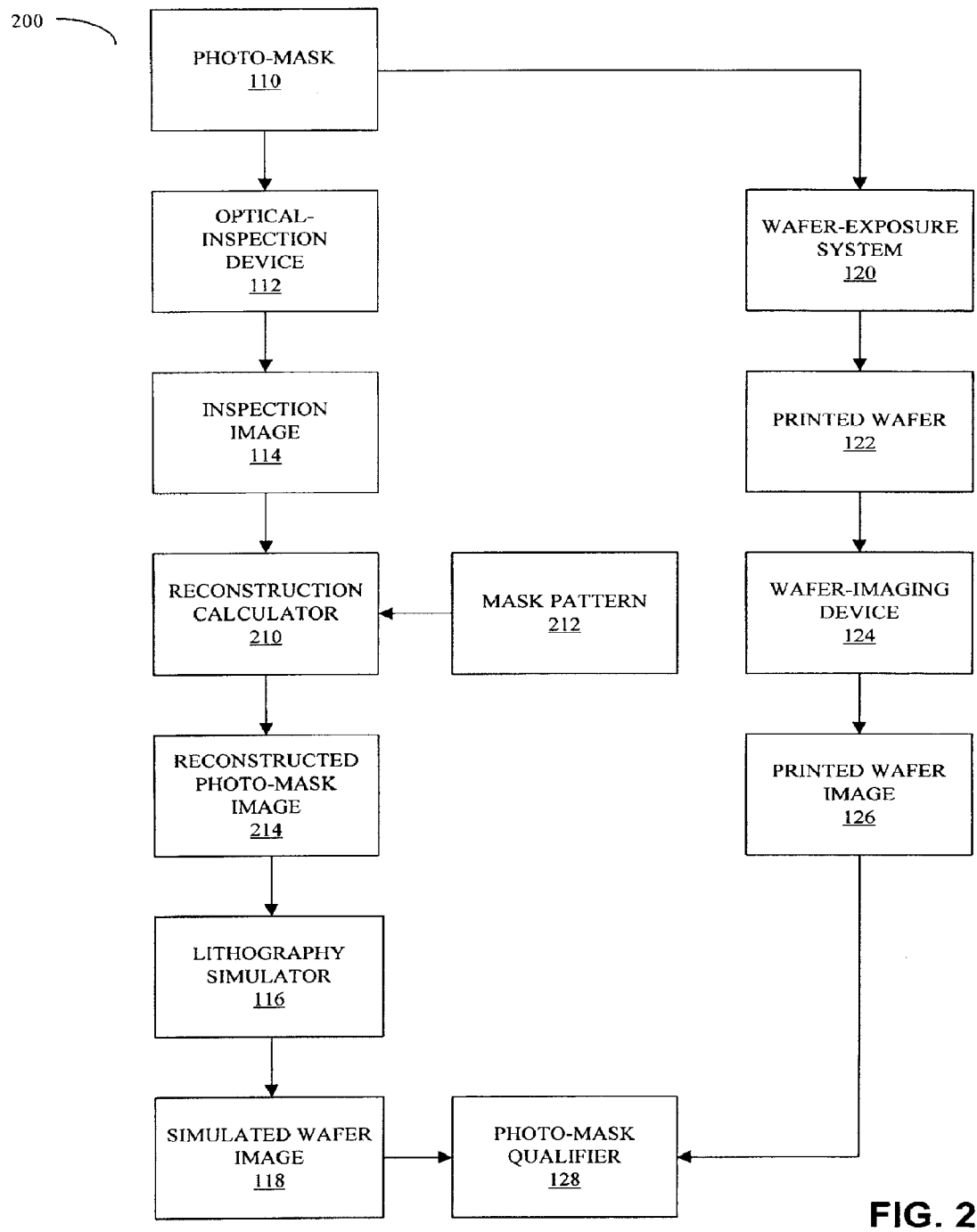
FIG. 2A is a block diagram illustrating a photo-mask inspection system in accordance with an embodiment of the present invention.
Figure 2B:
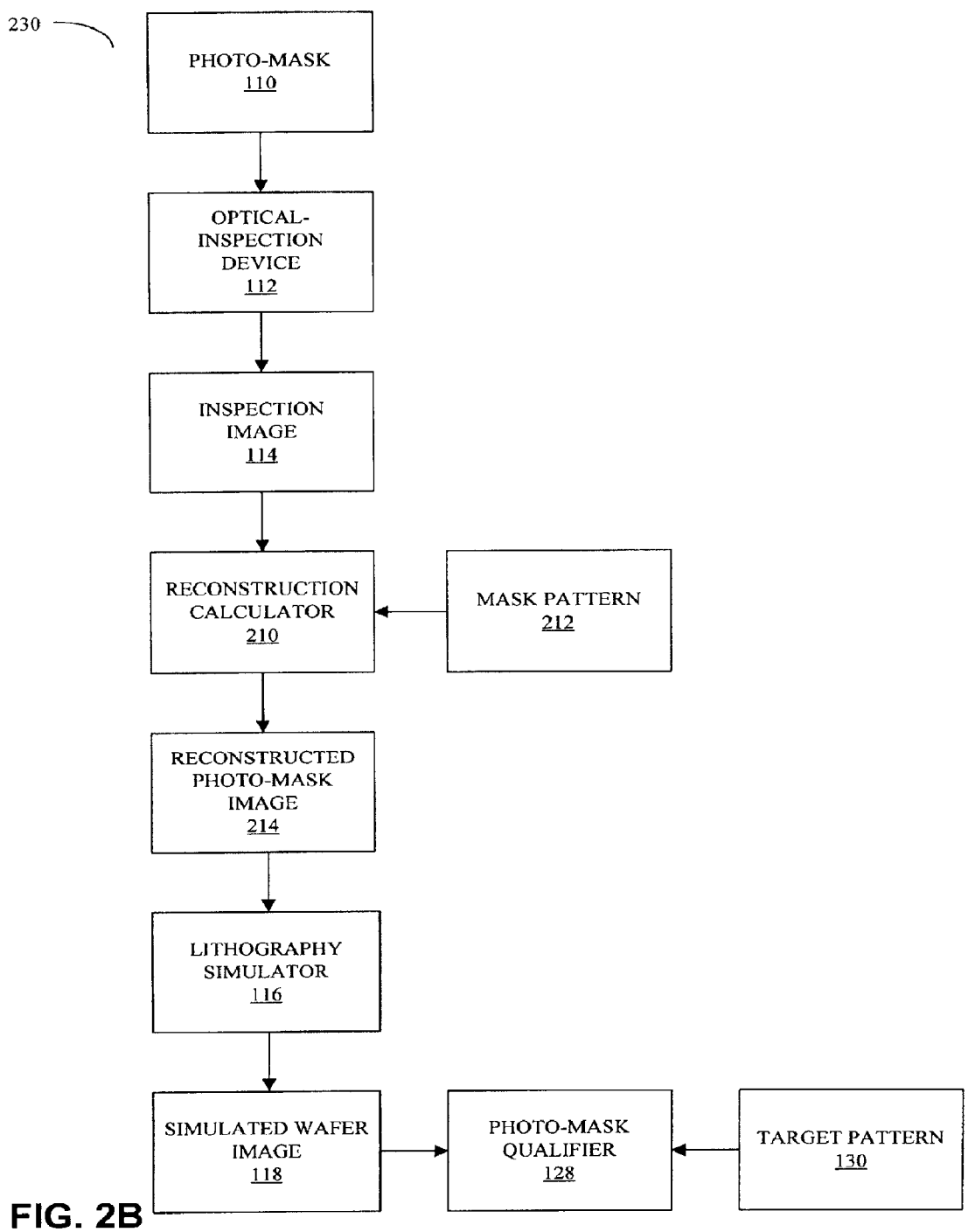
FIG. 2B is a block diagram illustrating a photo-mask inspection system in) accordance with an embodiment of the present invention.
Figure 2C:
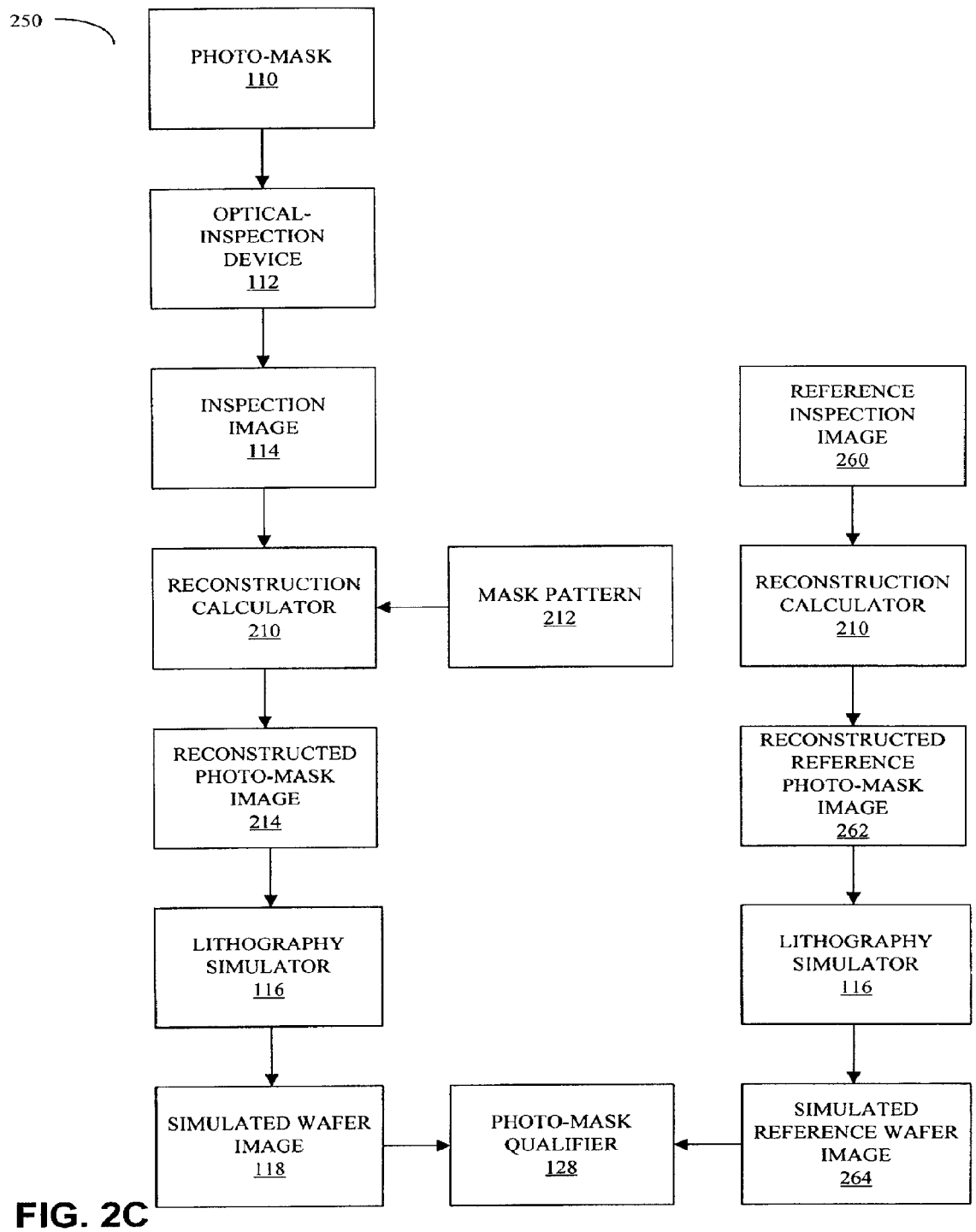
FIG. 2C is a block diagram illustrating a photo-mask inspection system in accordance with an embodiment of the present invention.

FIGS. 2A-2C provide block diagrams illustrating photo-mask inspection systems 200, 230 and 250 in accordance with an embodiment of the present invention. In photo-mask inspection system 200, a reconstruction calculator 210 may determine a reconstructed photo-mask image 214 (i.e., a second image) based on a (target) mask pattern 212 and the inspection image 114 (i.e., a first image). (Note that in some embodiments, patterns, such as the mask pattern 212, may have a document or file format that is similar to or the same as that for images, such as the reconstructed photo-mask image 214.) The reconstructed photo-mask image 214 may correct for deficiencies in the inspection image 114, such as defocus, aberrations, and/or lost information due to limitations of the optical-inspection device 112. Since the reconstructed photo-mask image 214 is a more faithful or accurate representation of the information in the photo-mask 110, the simulated wafer image 118 (based on an estimated photo-mask that corresponds to the reconstructed photo-mask image 214) may also be more accurate. As a consequence, the photo-mask qualifier 128 may be able to make more accurate qualification decisions, i.e., whether or not the photo-mask 110 is acceptable.

Note these qualification decisions may be based on comparisons between the simulated wafer image 118 and a printed wafer image (on a different wafer or die, or on the same wafer, such as the printed wafer image 126 illustrated in FIG. 2A or simulated reference wafer image 264 in FIG. 2C), comparisons between the simulated wafer image 118 and the target pattern 130 (as illustrated in FIG. 2B), comparisons between the simulated wafer image 118 and another simulated wafer image corresponding to the mask pattern 212, comparisons between the reconstructed photo-mask image 214 and another reconstructed photo-mask image (on the same or a different photo-mask), and/or comparisons between the mask pattern 212 and an estimated photo-mask corresponding to the reconstructed photo-mask image 214. For example, as illustrated in the photo-mask inspection system 250, comparisons may be made based on a reference inspection image 260 of at least a portion of the same or a different photo-mask. (Note that this is sometimes referred to as die-to-database inspection.) Using the reconstruction calculator 210 and/or the lithography simulator 216, reconstructed reference photo-mask image 262 and/or the simulated reference wafer image 264 may be determined. The reconstructed reference photo-mask image 262 and/or the simulated reference wafer image 264 may then be used in qualifying (or not) the photo-mask 110.

As discussed below with reference to FIG. 5, features in the reconstructed photo-mask image 214 may be identified based on these comparisons and the photo-mask 110 may be accepted (or not) based on at least a subset of the identified features. For example, the photo-mask 110 may be accepted or rejected based on a type, severity, and/or number of features (such as 1, 2, 5, 10, 25, 50, 100, 250, 500, and/or 1000 identified features per photo-mask) that are identified. In addition, the photo-mask 110 may be accepted or rejected based on an impact of such features on yield. Note that these features may correspond to defects in the photo-mask 110.

In some embodiments, at least the subset of the features is identified based on a set of pre-determined features (such as known defects) and/or statistical properties of the set of pre-determined features (such as their probabilities of occurrence). Furthermore, in some embodiments the photo-mask 110 is accepted (or not) based on a process window (such as a range of exposure times, a depth of focus, a range of exposure intensities, and/or a normalized image log slope) for the estimated photo-mask corresponding to the reconstructed photo-mask image 214 that is used in the lithography simulator 116. In addition, in some embodiments the photo-mask 110 is accepted (or not) based on features identified over or throughout the process window, and/or based on an impact on a critical dimension across the process window.

In some embodiments the photo-mask inspection system 200, the photo-mask inspection system 2030, and/or the photo-mask inspection system 250 include fewer or additional components, two or more components are combined into a single component, and/or a position of one or more components may be changed. For example, in some embodiments the lithography simulator 116 and the simulated wafer image 118 may be excluded. In these embodiments, the photo-mask 110 may be accepted (or not) based on comparisons of the reconstructed photo-mask image 214 and the mask pattern 212. Note that the photo-mask inspection system 200 and/or the photo-mask inspection system 230 may be used with chromium-on-glass photo-masks, alternating phase-shifting photo-masks, attenuating phase-shifting photo-masks, and/or multiple-exposure photo-masks (i.e., where patterns printed using two or more photo-masks are combined to produce a desired pattern).

Figure 3A:
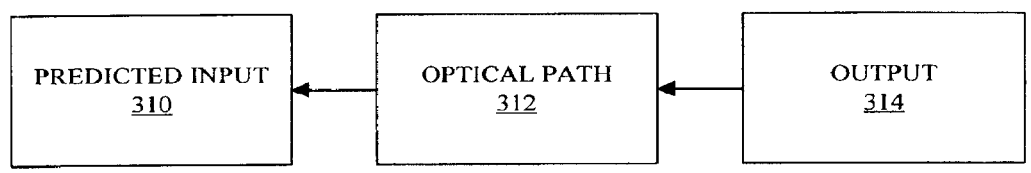
FIG. 3A is a block diagram illustrating an inverse optical calculation in accordance with an embodiment of the present invention.
Figure 3B:
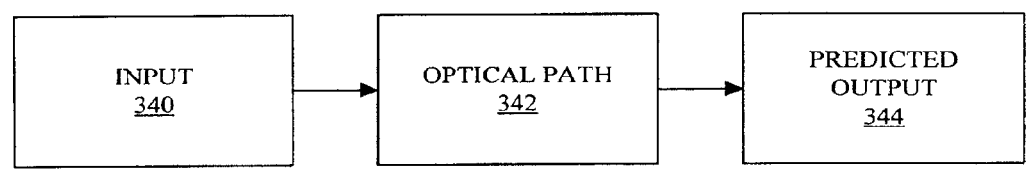
FIG. 3B is a block diagram illustrating a forward optical calculation in accordance with an embodiment of the present invention.
Figure 4A:
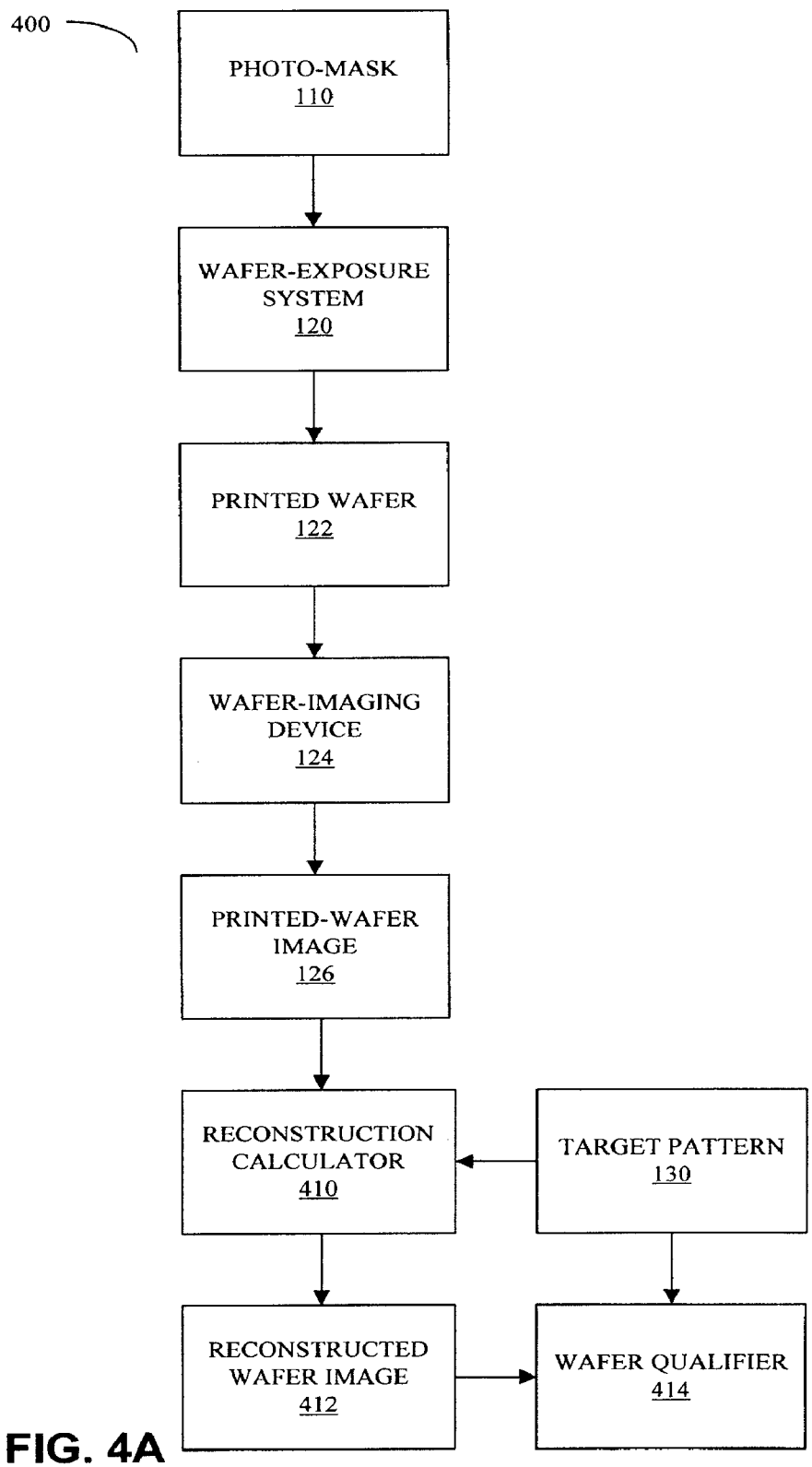
FIG. 4A is a block diagram illustrating a wafer inspection system in accordance with an embodiment of the present invention.
Figure 4B:
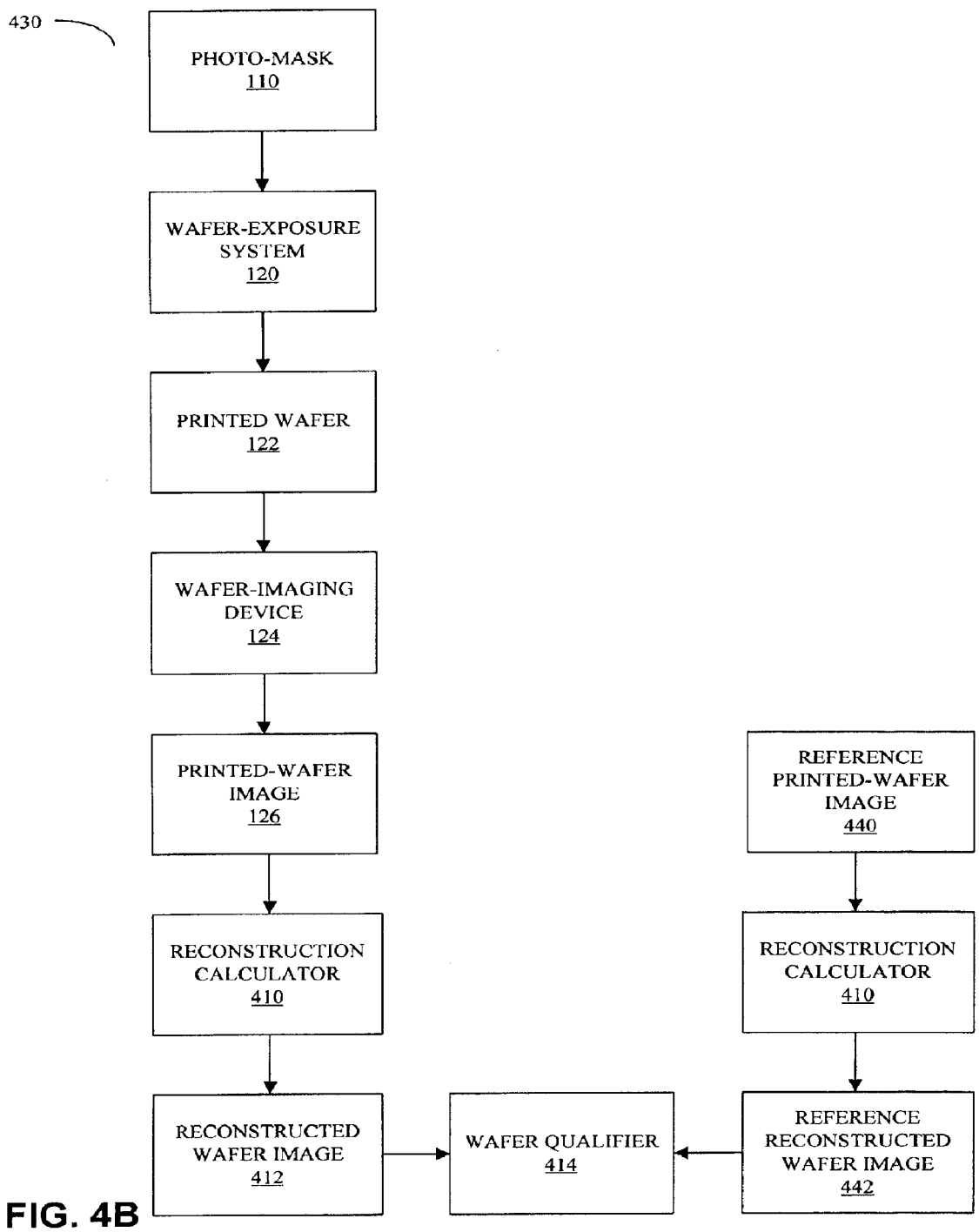
FIG. 4B is a block diagram illustrating a wafer inspection system in accordance) with an embodiment of the present invention.

In an example embodiment, the reconstructed photo-mask image 214 is determined using an inverse optical calculation. This is illustrated in FIG. 3A, which provides is a block diagram of an inverse optical calculation 300 in accordance with an embodiment of the present invention. In the inverse optical calculation 300, a suitably illuminated predicted input 310 (such as the reconstructed photo-mask image 214) is determined using an optical path 312 having an output 314 (such as the inspection image 114 in FIGS. 2A-2C) in one of its image planes. In particular, $$R = I^{-1} IM,$$

where I is a forward optical path (described in FIG. 3B below), $I^{-1}$ is an inverse optical path operator, M is the actual (physical) photo-mask pattern, I is an optical path operator, and the application of I to M is the inspection image or the printed-wafer image, and R is the reconstructed image. In the case of the photo-mask inspection systems 200 (FIG. 2A), 230 (FIG. 2B) and 250 (FIG. 2C), the optical path 312 corresponds to the optical-inspection device 112 (FIGS. 2A and 2B), while in the wafer inspection systems 400 and 430 (described below in FIGS. 4A and 4B), the optical path 312 corresponds to the wafer-imaging device 124 (FIGS. 4A and 4B). Furthermore, the optical path 312 may include illumination and/or optical effects. Note that the inverse optical calculation 300 is described further below with reference to FIG. 5.

As noted previously, the predicted input 310 may be characterized by additional spatial frequencies than the output 314. Using the photo-mask inspection systems 200 (FIG. 2A), 230 (FIG. 2B) and 250 (FIG. 2C) as an illustration, the mask pattern 212 (FIGS. 2A-2C) may be characterized by spatial frequencies within a first band of frequencies, the inspection image 114 (FIGS. 2A-2C) may be characterized by spatial frequencies within a second band of frequencies that is less than the first band of frequencies, and the reconstructed photo-mask image 214 (FIGS. 2A-2C) may be characterized by spatial frequencies within a third band of frequencies that is greater than the second band of frequencies. Furthermore, the third band of frequencies may approximately include the first band of frequencies.

The inverse optical calculation 300 may utilize more than one output 314. Using the photo-mask inspection systems 200 (FIG. 2A), 230 (FIG. 2B) and 250 (FIG. 2C) as an illustration, two or more inspection images (such as the inspection image 114 in FIGS. 2A-2C) may be used in the reconstruction calculator 210 (FIGS. 2A-2C). For example, there may be two inspection images that are each determined using different wavelengths, different focal conditions (i.e., on different focal surfaces or planes), and/or different imaging conditions in the optical inspection device 112 (FIGS. 2A-2C). These inspection images may include intensity, magnitude and/or phase information. For example, images that include magnitude and relative phase information may be measured by generating an interference pattern using measurement and reference beams derived from a common light source or that are spatially and temporally coherent. Alternatively, phase contrast optics may be utilized. In some embodiments, the difference of two inspection images may be used as the output 314 in the inverse optical calculation 300. Furthermore, in some embodiments each of the inspection images used in the inverse optical calculation 300 or a term(s) including some combination of the inspection images may be multiplied by a corresponding weight. In this way, the calculation (and thus, the results) may emphasize one or more of the inspection images relative to other inspection images used in the inverse optical calculation 300.

In another example embodiment, the simulated wafer image 118 (FIGS. 2A-2C) is determined using a forward optical calculation. This is illustrated in FIG. 3B, which provides is a block diagram of a forward optical calculation 330 in accordance with an embodiment of the present invention. In the forward optical calculation 330, a predicted output 344 (such as the simulated wafer image 118 in FIGS. 2A-2C) is determined using an optical path 342 having a suitably illuminated input 340 (such as the reconstructed photo-mask image 214 in FIGS. 2A-2C or a corresponding estimated photo-mask) at one of its object planes. In this case, the optical path 342 corresponds to the lithography simulator 116 (FIGS. 2A-2C) and may have a different numerical aperture, different illumination configuration, and/or a different wavelength(s) than that used in the optical path 312 (FIG. 3A). Furthermore, in some embodiments the optical path 342 may include some or all of the aspects of the photolithographic process, such as illumination settings, the electromagnetics of the photo-mask, the stepper optics, etc. Note that in some embodiments the lithography simulator 116 (FIGS. 2A-2C) also includes a model of a photoresist used in a photolithographic process. And in some embodiments, the lithography simulator 116 (FIGS. 2A-2C) includes flare and/or etch effects.

In some embodiments the inverse optical calculation 300 and/or the forward optical calculation 330 include fewer or additional components, two or more components are combined into a single component, and/or a position of one or more components may be changed. Note that calculations corresponding to one or more optical paths in an inverse optical calculation and/or a forward optical calculation may be implemented using Fourier-optical techniques. Furthermore, the optical paths in an inverse optical calculation and/or a forward optical calculation may include multiple models of optical paths, such as when inspection images from two or more different optical-inspection devices and/or wafer-imaging devices are used to determine a reconstructed image. Also note that while optical path 312 and optical path 342 have been traversed in particular directions, each of these optical paths may be traversed in either direction.

While these optical calculations and the image processing techniques have been discussed in the context of photo-mask inspection, this approach may be applied in wafer inspection, and in particular, to patterned-wafer inspection. This is illustrated in FIGS. 4A and 4B, which provide block diagrams of wafer-inspection systems 400 and 430 in accordance with an embodiment of the present invention. After measuring the printed-wafer image 126, a reconstruction calculator 410 may determine a reconstructed wafer image 412 based on the target pattern 130 and the printed-wafer image 126. As described in FIG. 3A, the reconstruction calculator 410 may utilize an inverse optical calculation.

The reconstructed wafer image 412 may correct for deficiencies in the printed-wafer image 126, such as defocus, aberrations, and/or lost information due to limitations of the wafer-imaging device 124. Since the reconstructed wafer image 412 is a more faithful or accurate representation of the patterned information on the printed wafer 122, wafer qualifier 414 may be able to make more accurate qualification decisions, i.e., whether or not the printed wafer 122 is acceptable. As illustrated in FIG. 4A, these qualification decisions may be based on comparisons between the reconstructed wafer image 412 and the target pattern 130.) Alternatively, as illustrated in FIG. 4B, the comparison may utilize a reference reconstructed wafer image 442 that is determined from a reference printed-wafer image 440. This reference printed-wafer image may be from at least a portion of a same wafer or a different wafer.

During these comparisons, features in the reconstructed wafer image 412 (such as those corresponding to defects in the printed wafer 122) may be identified and the printed wafer 122 may be accepted (or not) based on at least a subset of the identified features. For example, the printed wafer 122 may be accepted or rejected based on a type, severity, and/or number of features or defects (such as 1, 2, 5, 10, 25, 50, 100, 250, 500, and/or 1000 identified features or defects per wafer) that are identified. In addition, the printed wafer 122 may be accepted or rejected based on an impact of such features or defects on yield. And in some embodiments, statistics based on the identified features or defects are determined. These statistics may include types of features (such as point, line or critical dimension defects) that may be used to classify the printed wafer 122 and/or revise a manufacturing process that produced the printed wafer 122.

In some embodiments the wafer inspection system 400 and/or the wafer inspection system 430 include fewer or additional components, two or more components are combined into a single component, and/or a position of one or more components may be changed. Note that the wafer-image reconstruction illustrated in FIGS. 4A and/or 4B may be applied in the photo-mask inspection system 200 (FIG. 2A), the photo-mask inspection system 230 (FIG. 2B), and/or the photo-mask inspection system 250 (FIG. 2C).

Figure 5A:
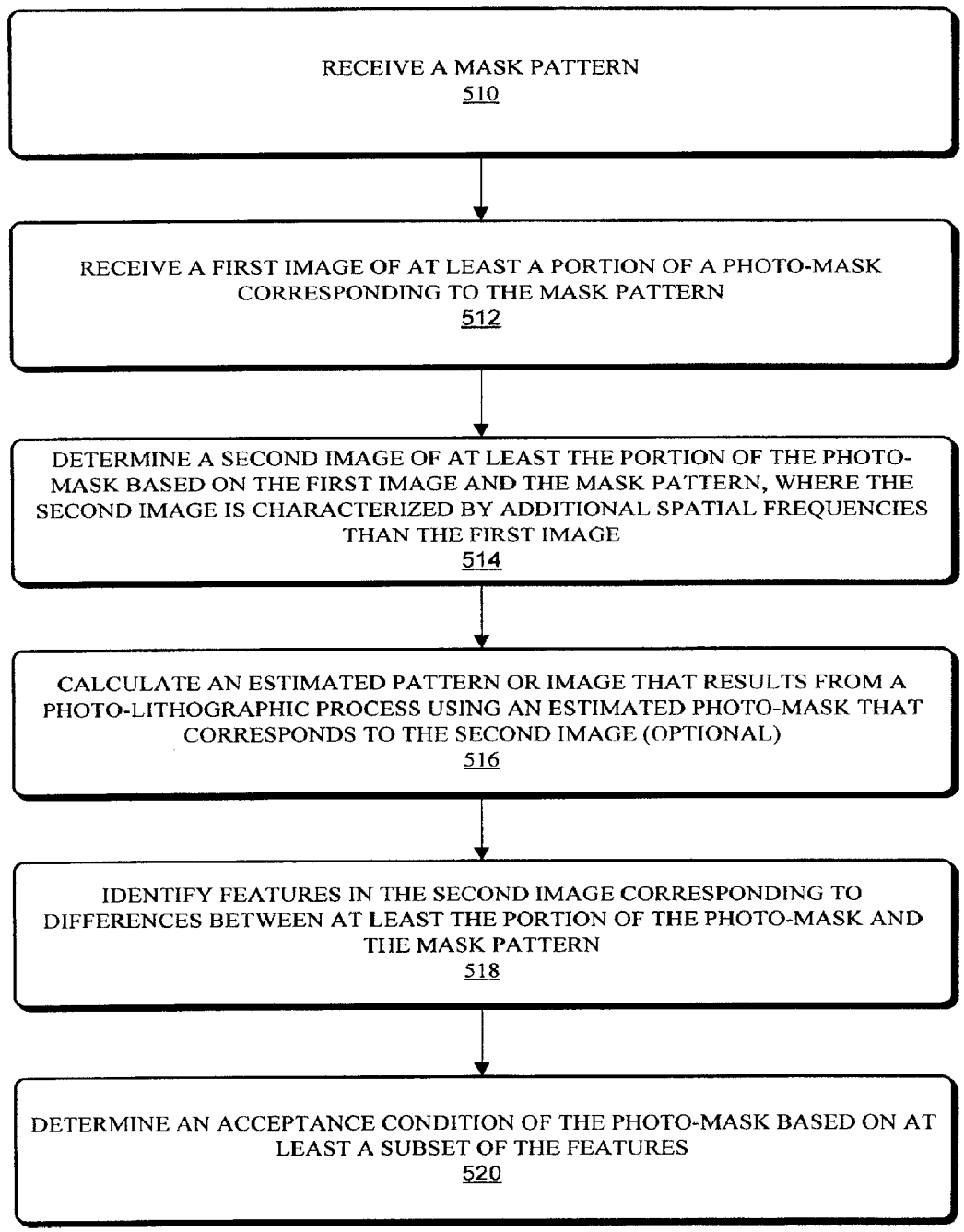
FIG. 5A is a flow chart illustrating a process for determining an image in accordance with an embodiment of the present invention.

We now discuss methods for determining such reconstructed images. FIG. 5A provides a flow chart illustrating a process 500 for determining an image in accordance with an embodiment of the present invention. During this process 500, the system receives a mask pattern (510) and a first image of at least a portion of a photo-mask that corresponds to the mask pattern (512). The system determines a second image of at least the portion of the photo-mask based on the mask pattern and the first image (514). This second image is characterized by additional spatial frequencies (i.e., it includes additional magnitude and/or phase information at one or more additional spatial frequencies) than the first image. Then the system optionally calculates an estimated wafer image or pattern that results from a photo-lithographic process using an estimated photo-mask that corresponds to the second image (516). Furthermore, the system identifies features in the second image corresponding to differences between at least the portion of the photo-mask and the mask pattern (518), and the system determines an acceptance condition of the photo-mask based on at least a subset of these features (520).

Figure 5B:
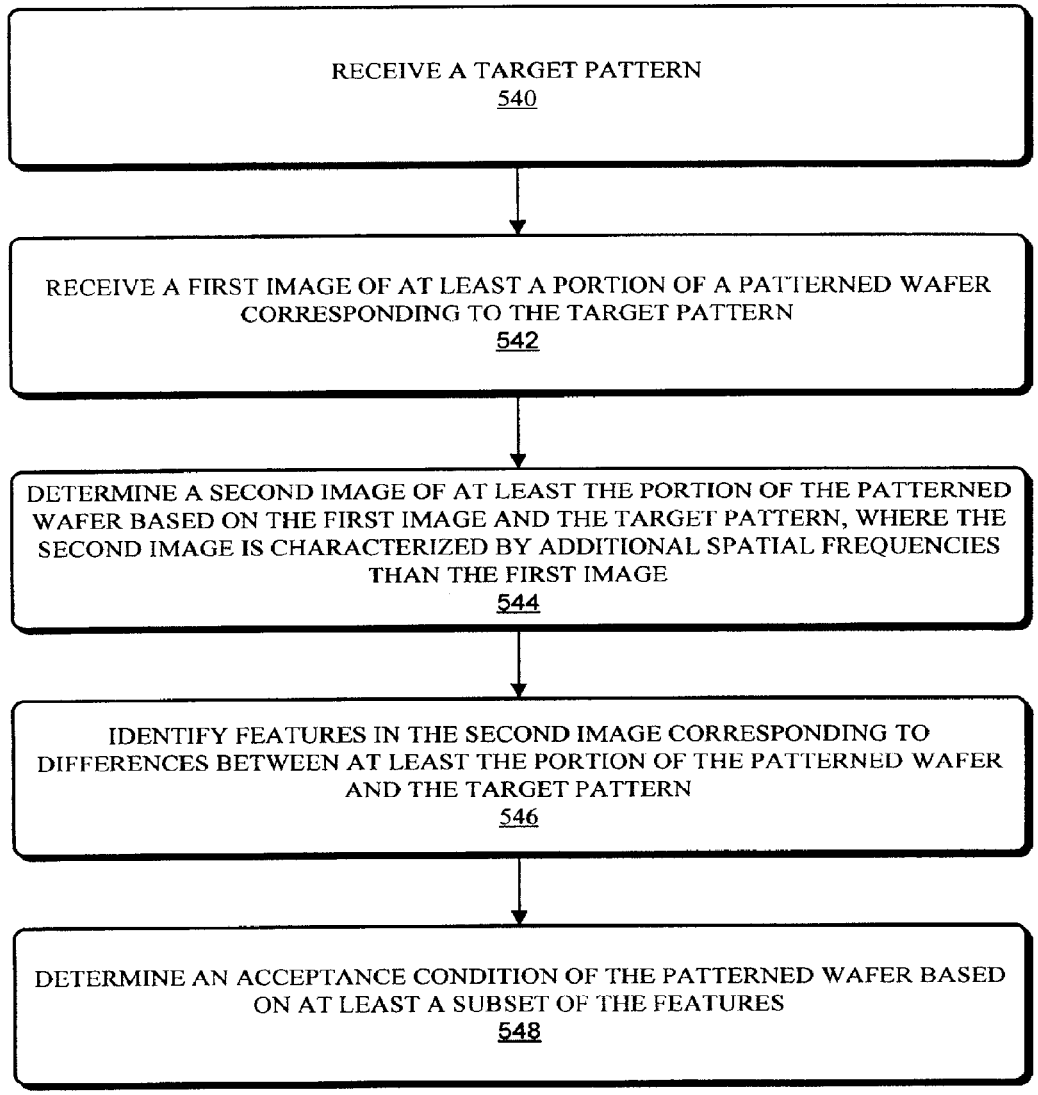
FIG. 5B is a flow chart illustrating a process for determining an image in accordance with an embodiment of the present invention.

FIG. 5B provides a flow chart illustrating a process 530 for determining an image in accordance with an embodiment of the present invention. During this process 530, the system receives a target pattern (540) and a first image of at least a portion of a patterned wafer that corresponds to the target pattern (542). The system determines a second image of at least the portion of the patterned wafer based on the target pattern and the first image (544). This second image is characterized by additional spatial frequencies (i.e., it includes additional magnitude and/or phase information at one or more additional spatial frequencies) than the first image. Furthermore, the system identifies features in the second image corresponding to differences between at least the portion of the patterned wafer and the target pattern (546), and the system determines an acceptance condition of the patterned wafer based on at least a subset of these features (548).

Note that in some embodiments of the process 500 (FIG. 5A) and/or the process 530 there may be additional or fewer operations, the order of the operations may be changed, and two or more operations may be combined into a single operation. For example, the calculation (516 in FIG. 5A) may be performed for a variety of scenarios, including out of focus conditions, dose variations, etc., and features in one or more of the associated second images (i.e., the reconstructed images) may be identified (518 in FIG. 5A) based on the estimated wafer patterns or simulated wafer images that are calculated. In this way, it would be possible to determine that a particular defect is fatal when slightly overexposed, even though it is negligible at the nominal dose.

In addition, in some embodiments the determining (514 in FIG. 5A) and identifying (518 in FIG. 5A) operations are repeated iteratively, and at least the subset of the features identified have a probability of occurrence that exceeds a pre-determined value. For example, as discussed below the features identified in a series of iterations may be the best approximation to one or more first images (i.e., based on a comparison with projection of the corresponding one or more reconstructed images through a model of the optical path). Alternatively, the features identified may be those that result in the worst-case estimated wafer pattern or simulated wafer image. Furthermore, at least some of the identified features (such as a deviation in geometric position of a line edge in the estimated wafer pattern) may be multiplied by a factor (such as 2x) to ensure that the results are conservative. And in some embodiments, the features identified may correspond to multiple simulations that have error functions that are within an order of magnitude difference relative to the simulation with the best approximation to the first image (i.e., the simulation with a reconstructed image that, when projected through a model of the optical path, is the best approximation to the first image).

Furthermore, in some embodiments acceptance of a photo-mask and/or a patterned wafer may be fully automated, while in other embodiments it may not be fully automated. Thus, information may be presented to a user, who may verify an acceptance recommendation made by the system or who may independently determine whether or not to accept the photo-mask and/or the patterned wafer. For example, if a confidence metric for the results is less than a pre-determined value (such as when there are two very different reconstructed images that each correspond to a similar value of the error function H), the user may be consulted to make a final decision or judgment. In these embodiments, a ranking (such as a top-N list) of at least the subset of identified features may be presented to the user. This ranking may indicate which features or defects are deemed to be the most serious using comparisons of simulated wafer images and target patterns, comparisons of simulated wafer images that are determined using an estimated photo-mask (corresponding to the reconstructed photo-mask image) and the (target) mask pattern, comparisons of reconstructed images and target patterns or mask patterns, a pre-determined set of features (known defects having pre-determined sizes and/or phases), and/or statistics for the pre-determined set of features (such as their probabilities of occurrence). The user may observe the borderline cases. To assist the user in this process, in some embodiments reconstructed images and/or simulated wafer images may also be presented to the user. This approach may allow the user to identify real defects that result in reduced process windows and lower yield at the wafer level, while ignoring false defects that may cause the mask shop to erroneously scrap or rework good photo-masks or the integrated-circuit manufacturer to discard a patterned wafer.

It will be recognized by one of ordinary skill in the art that the inverse optical calculation 300 described above in FIG. 3A is ill defined. In particular, numerous possible reconstructed images may result in the same observed inspection image 114 (FIGS. 2A-2C) or printed wafer image 126 (FIGS. 2A, 4A and 4B). Therefore, as noted above the reconstructed image may be selected such that it is 'most likely' to represent the actual photo-mask or the actual patterned wafer. A variety of constraints and additional criteria may be imposed when determining the solution(s) to this problem in order to find a unique answer(s). For example, reconstructed images that, when projected through the optical path of the optical inspection device 112 (FIGS. 2A-2C) or the wafer-imaging device 124 (FIGS. 4A and 4B), correspond to inspection image 114 (FIGS. 2A-2C) or the printed-wafer image 126 (FIGS. 2A, 4A and 4B) are more likely to represent the actual photo-mask or patterned wafer than other reconstructed images (i.e., has the smallest value of the error function).

Since defects are not part of the design data (i.e., the mask pattern or the target pattern), a certain degree of ambiguity will also exist when determining the exact geometric configurations and phases of the defects. Using a dark-field image as an example, in the limit of) very small defects below the resolution limit of the optical-inspection device 112 (FIGS. 2A-2C) or wafer-imaging device 124 (FIGS. 2A, 4A, and 4B), the defects may be imaged as small gray dots. The amount of light transmitted by such defects may provide an indication of the defect size, but approximately the same amount of transmission may be achieved by a more opaque defect of a larger size or by a more transparent defect of a smaller size.

It is possible to resolve some of this uncertainty as to the exact nature of the defect by collecting inspection images or printed-wafer images at multiple focus settings and programming the inverse optical calculation to determine the optimum photo-mask or wafer pattern that would most closely replicate the measured defects as a function of focus. In addition, the ambiguity may be resolved by optimizing over several optical paths, including several illumination configurations for each path (thus, in general, multiple inspection images may be used, including images from different optical-inspection devices and/or wafer-imaging devices). For example, a transmitting defect on the surface of a chromium-on-glass photo-mask that results in a phase shift may be determined. In addition, other parameters of the optical-inspection device 112 (FIGS. 2A-2C) or wafer-imaging device 124 (FIGS. 2A, 4A, and 4B) may be varied or modified, including the illumination and projection optics configurations, in order to produce inspection images or printed-wafer images that may be used in the inverse optical calculation. In all combinations of such conditions, the goal of the inversion optical calculation is to find the unique solution that simultaneously minimizes the difference between the measured inspection images or the measured printed-wafer images and the images that result when the reconstructed images are projected through the optical path of the optical inspection device 112 (FIGS. 2A-2C) or the wafer-imaging device 124 (FIGS. 2A, 4A and 4B).

However, even with the use of multiple imaging conditions, some ambiguity may still remain in determining the exact size, shape, phase, and/or attenuation of one or more of the defects. As noted previously, in some embodiments of photo-mask inspection, the reconstructed image that is used to determine (via a corresponding estimated photo-mask in a forward optical simulation) an estimated wafer pattern or simulated wafer image may be that which, when projected through the optical path, is the closest match or one of the closest matches to the inspection image or the printed-wafer image. Furthermore, this reconstructed photo-mask may also provide a worst-case estimate of the defects across the process window.

Other constraints based on a priori knowledge of the photo-mask or wafer manufacturing process may also be applied to resolve the ambiguity among several competing candidate defect possibilities. For example, there may be a priori knowledge about typical defect types (including the distribution of defect sizes and phases) that arise during the photo-mask or) patterned-wafer manufacturing process. In addition, information may also be obtained from neighboring defects on the photo-mask or patterned wafer that is being inspected, or from previous photo-masks or patterned wafers that were manufactured on the same process line and inspected. For example, given the likelihood that point defects tend to be generated by common mechanisms, a common link between more than one such defect may constrain the possible solution options in the inverse optical calculations.

One common type of defect is known as a critical dimension (CD) defect or a sizing error. This type of defect is not an isolated feature (i.e., a feature where one does not belong), or a missing feature (i.e., where one was expected), but rather an error in the dimension of the feature being patterned on the photo-mask or the patterned wafer. Given the often blurry grayscale inspection images or printed-wafer images, it may be difficult for a user or operator to resolve these defects manually (i.e., to identify the defects in the inspection images or printed-wafer images). In addition, the large mask error enhancement factors (MEEFs) of leading-edge lithographic processes makes it important to understand how such observed CD defects on or in photo-masks impact wafer manufacturing (i.e., the printed wafer patterns). The present invention is well suited to identifying and assessing the impact (i.e., the significance) of these and other defects in the photo-masks and patterned wafers.

We now discuss example embodiments of an inverse optical calculation to determine a reconstructed image. The inverse optical calculation may be based on minimization of an error function (which is also sometimes referred to as a cost function or a Hamiltonian function). Referring to FIGS. 2A-2C, during each iteration of the calculation the error function may be a function of the difference between an image that results when the reconstructed photo-mask image 214 (or the reconstructed wafer image 412 in FIGS. 4A and 4B) is projected through the optical path of the optical inspection device 112 (or the wafer-imaging device 124 in FIGS. 4A and 4B) and the inspection image 114 (or the printed-wafer image 126 in FIGS. 4A and 4B). In some embodiments, the reconstructed image initially corresponds to the mask pattern (or the target pattern), and as the calculation progresses this reconstructed image is allowed to evolve while the inspection image 114 (or the printed-wafer image 126 in FIGS. 4A and 4B) is held constant. Including multiple inspection images (or multiple printed-wafer images), in some embodiments the error function (H) equals $$\sum_{j=1}^{N} w_j |I_j - I_{oj}|^n,$$

where $I_j$ is the forward projection of the jth reconstructed image (out of N reconstructed images in this example) through the optical path, $w_j$ is a corresponding weight, $I_{oj}$ is the jth inspection image (or the jth printed-wafer image), and n is a power. Note that the error function (H) approaches zero as $I_j$ approaches $I_{oj}$.

In an example embodiment, N is 3 and n is 2. The 3 inspection images (or printed-wafer images) may be determined at 3 different focal planes (or focus settings) in the optical-inspection device 112 (or wafer-imaging device 124 in FIGS. 2A, 4A, and 4B). For example, with a wavelength of 260 nm, the focal planes may be at −600 nm (relative to nominal focus), at 0 nm (i.e., at nominal focus), and 600 nm (relative to nominal focus). Alternatively or in addition, the 3 inspection images (or printed-wafer images) may be determined at three different wavelengths or imaging conditions. Furthermore, a corresponding set of weights $\{w_j\}$ may be 1, 0.1, and 1.

In other embodiments, the weights are varied as the inverse optical calculation) progresses and/or different weights are used for specific parts (or even pixels) of an image. For example, the weights may be determined based on the difference between $I_j$ and $I_{oj}$ at a given step in the calculation. This approach may exaggerate the features or defects, especially when the calculation is close to a local or global minimum and the error function (H) corresponds to small differences. Thus, in general the error function (H) may be expressed as a double integral over the image area and there may be separate time-dependent weights for $I_j$ and $I_{oj}$. Furthermore, in some embodiments the error function (H) is expressed as a relative difference between $I_j$ and $I_{oj}$ for at least a portion of the calculation as it progresses.

We now describe an example embodiment of the forward projection used when determining the error function. For simplicity, coherent illumination of the estimated photo-mask is utilized. Furthermore, the electric field falling upon the photo-mask is approximately constant. Thus, the clear regions of the photo-mask pass the light, while the opaque regions block the light. It follows that a scalar electric field E, just behind the photo-mask, may be expressed as $$E(\vec{r}) = \begin{Bmatrix} 0 & \text{chrome} \\ 1 & \text{glass} \end{Bmatrix},$$

where $\vec{r} = (x, y)$ is a point on the (x,y) plane. As discussed below with reference to FIG. 6, this representation of the photo-mask may be re-expressed using a function φ (referred to as a level-set function) having positive regions that indicate glass and negative regions that indicate chrome. Furthermore, the level-set function may equal zero at the boundaries or contours of the photo-mask). Therefore, the electric field E associated with the photo-mask may be re-expressed as a function of this level-set function, i.e., $$E(\vec{r}) = \hat{h}(\phi(x,y)),$$

where $\hat{h}$ is the Heaviside function $$\hat{h}(x) = \begin{Bmatrix} 1 & x \geq 0 \\ 0 & x < 0 \end{Bmatrix}.$$

Since an ideal diffraction limited lens acts as a low-pass filter, this may be used as an approximation to the actual (almost but not quite perfect) lens in the optical path of the optical-inspection device (in this example). Mathematically, the action of the lens may be expressed as $$A(\vec{r}) = f^{-1}(\hat{C}(f(E(\vec{r}))))$$

where $A(\vec{r})$ indicates the electric field distribution on the wafer, f indicates the Fourier transform, $f^{-1}$ indicates the inverse Fourier transform, and $\vec{C}$ indicates the pupil cutoff function, which is zero for frequencies larger than a threshold determined by the numerical aperture of the lens, and one otherwise. Thus, the pupil function is $$\hat{C}(k_x, k_y) = \hat{h}(k_{max}^2 - [k_x^2 + k_y^2]) = \begin{Bmatrix} 0 & k_x^2 + k_y^2 \geq k_{max}^2 \\ 1 & k_x^2 + k_y^2 < k_{max}^2 \end{Bmatrix},$$

wherein $k_x$, $k_y$ and $k_{max}$ represent frequency coordinates in Fourier space. Therefore, the inspection image (at the detector) is simply the square of the electric field $$I(\vec{r}) = |A(\vec{r})|^2.$$

Combining these two equations, we find $$F(\phi(x,y)) = (|f^{-1}(\hat{C}(f(\hat{h}(\phi(x,y)))))|^2).$$

This is a self-contained formula for the image seen by the optical-inspection device (or, in alternate example, by the wafer-imaging device).

Note that this is just one embodiment of the forward projector that can be used within the scope of this invention, chosen by way of example due to its relative simplicity. More sophisticated forward models also fall within the scope of the present invention. Such models may take into account, by way of example but not limitation, various illumination conditions (e.g., off-axis, incoherent), the actual electromagnetics of the light field interacting with the photo-mask, various types of photo-masks other than chrome on glass (e.g., attenuated phase shifting, strong phase shifting, other materials, etc.), the polarization of the light field, the actual) properties of the lens (such as aberrations), and/or the vector nature of the electromagnetic field as it propagates through the optical path.

Figure 6:
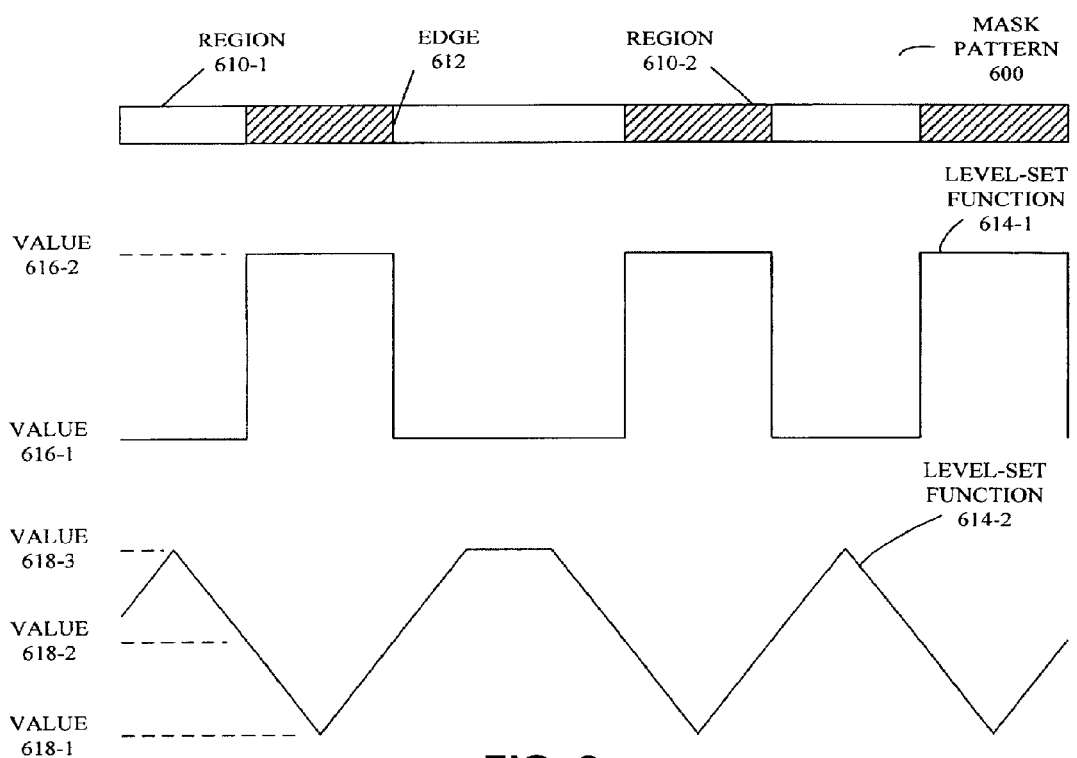
FIG. 6 is a block diagram illustrating a mask pattern and corresponding level-set functions in accordance with an embodiment of the present invention.

We now describe the level-set functions in more detail. In the inverse optical calculation, the reconstruction image(s) being modified may be represented as a function having a set of values that is larger than those in the inspection images or the printed-wafer images. As discussed previously, in one embodiment the function is a level-set function. This is illustrated in FIG. 6, which provides a mask pattern 600 and corresponding level-set functions 614 in accordance with an embodiment of the present invention. The mask pattern 600 includes alternating regions with glass (610-1) and chromium (610-2). Transitions from one region to another are characterized by a contour or an edge, such as edge 612. When viewed from a direction perpendicular to a plane of the photo-mask, the edge 612 defines the mask pattern 600.

Level-set function 614-1 has two values 616. The edge 612 may correspond to a mid-point between these two values 616. In contrast, level-set function 614-2 has three values 618, and the edge 612 may correspond to value 618-2. While not illustrated in FIG. 6, the level-set functions 614 extend into the plane of FIG. 6 (i.e., they are 3-dimension functions). As is known to one of skill in the art, there are many alternate level-set functions and/or configurations that may be used. For example, in some embodiments one or more separate level-set functions and/or separate images may be used for the features or defects.

As illustrated by level-set function 614-2, in some embodiments the level-set function may be expressed as a signed distance function relative to the contour or edge 612 (i.e., the value of the level-set function in at least a region is a function of the distance from the edge 612). This formulation may allow effects that occur nearer to the edge 612 (such as CD defects) to be highlighted. However, since features or defects in photo-masks and patterned wafers may occur at random locations (including those far removed from the edge 612), the level-set function 616-1 may be useful in that it provides an equal weighting with respect to the edge 612.

In some embodiments, during each iteration of the inverse optical calculation the level-set function corresponding to one of the reconstructed images being modified is updated according to $$\phi_{i+1} = \phi_i + \Delta t \cdot \nabla(H),$$

where $\phi_{i+1}$ is an updated version of the level-set function, $\phi_i$ is the current version of the level-set function, $\Delta t$ is a step size in the calculation and $\nabla(H)$ is a gradient or a derivative of the error function. In an example embodiment, $\nabla(H)$ is $$\left.\frac{\delta H}{\delta \phi}\right|_{\varphi_i},$$

i.e., it is the Frechet derivative of the error function H. Furthermore, in some embodiments $\nabla(H)$ is the direction of steepest descent for minimizing or optimizing H by changing $\phi$. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of the inverse optical calculation. In particular, the error function H may be allowed to increase during some steps as the calculation evolves. In this way, the global minimum in the multi-dimensional space may be determined. Note that the size of this multi-dimensional space a number of quantization levels to the power of the number of pixels in the reconstructed images. In an example embodiment, these images have at least 1 million pixels (for example, 1024×1024).

In one embodiment, in any iteration of the calculation changes in $\phi$ that decrease or increase the error function up to 0.5% are performed. If a larger change will result (i.e., $\Delta H > 0.5\%$), the step size $\Delta t$ is decreased by a factor that is at least greater than 1 and the change in $\phi$ is implemented (or not) based on a probability and a value P given by $$e^{\frac{-kH_{i+1}}{H_i}},$$

where $H_{i+1}$ is the error function in the i+1$^{th}$ iteration (if the change in $\phi$ is implemented) and $H_i$ is the error function in i$^{th}$ iteration (note that the ratio of $H_{i+1}/H_i$ equals 1+$\Delta H$). In some embodiments k is 0.155. For example, if the value P is 0.3 and a random number between 0 and 1 is less than P, the error function is increased before proceeding. In this way, the inverse optical calculation initially takes large steps and thereby explores the solution space.

Furthermore, in some embodiments, the inverse optical calculation is divided into a series of overlapping sub-problems (also referred to as work units) at least some of which are processed independently and/or concurrently. These work units may be based on elements or structures (for example, repetitive structures) in the mask pattern, the target pattern, and/or in one or more of the inspection images or printed-wafer images. In some embodiments, the works units are selected such that there is a probability exceeding a pre-defined value (i.e., a high probability) that most if not all of the work units include at most one defect (for example, the work units may be based on differences between an inspection image and a simulated inspection image that is determine using a theoretical mask pattern). Furthermore, in some embodiments the work units may partially overlap neighboring work units. For example, the work units may be between 10,000 nm$^2$ and 100 μm$^2$ in size.

In some embodiments, the inverse optical calculation is run for 100, 1000 or 10,000 iterations at which point the optimal solution has been determined. In other embodiments, the calculation is stopped based on convergence criteria, such as oscillatory behavior, a relative and/or absolute difference between the inspection images (or the printed-wafer images) and the images that result when the reconstructed images are projected through the optical path of the optical inspection device 112 (or the wafer-imaging device 124 in FIGS. 4A and 4B), the latest change to the error function H, and/or the history of changes to the error function H. For example, the relative difference may be less than 1% and/or the absolute difference may be 10 nm for a critical dimension of 100 nm. Note that is some embodiments, the level-set function is re-distanced (i.e., restored to one having the distance function property relative to the edge 612) at intermediate iterations during the calculation. In an example embodiment, such re-distancing occurs at least every 20 iterations (for example, every 14 iterations).

Using this inverse calculation approach, features smaller than the wavelength of the light source used to perform optical measurements or to print wafer patterns in a photolithographic process may be determined. For example, in simulations using a light source having a wavelength of 260 nm, features and defects as small as $(10 \text{ nm})^2$ on a patterned wafer or as small as $(40 \text{ nm})^2$ on a photo-mask were determined.

Figure 7:
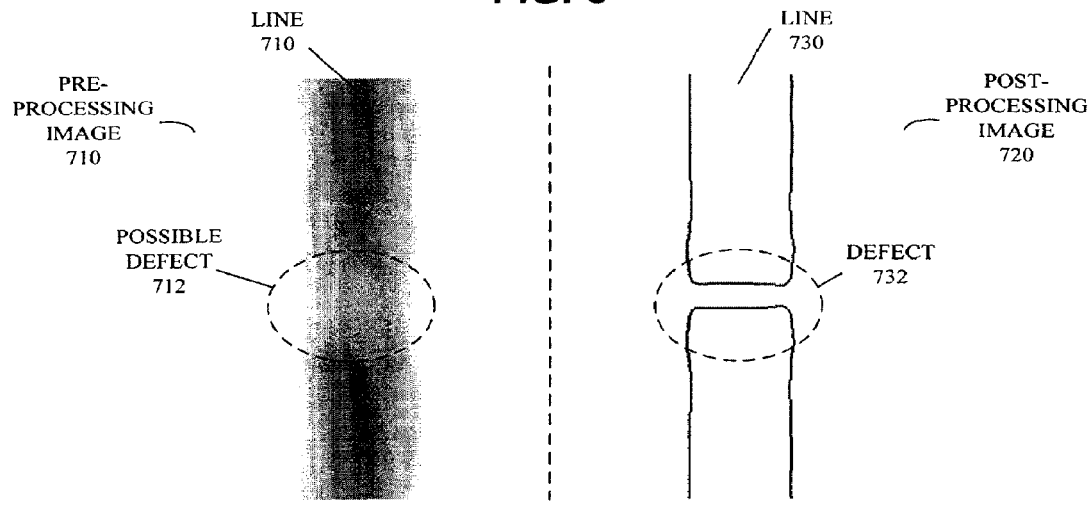
FIG. 7 is a block diagram illustrating a pre-processing image and a post-processing image in accordance with an embodiment of the present invention.

FIG. 7 provides a block diagram illustrating a pre-processing image 710 (i.e., an inspection image or a printed-wafer image) and a post-processing image 720 (i.e., a reconstructed photo-mask image or a reconstructed wafer image) in accordance with an embodiment of the present invention. In the pre-processing image 710, a line 710 (such as a 160-nm wide feature on a photo-mask) may include a possible defect 712. However, as noted previously, the defect may be obscured due to the limitations of the optical measurement equipment. After performing the inverse optical calculation, line 730 in the post-processing image 720 is well defined, allowing defect 732 (a 40-nm gap in the photo-mask) to be identified. The pre-processing image 710 was simulated using a model of the optical path that included disk illumination (sigma=0.75), a numerical aperture of 0.67, and a wavelength of 260 nm.

Figure 8:
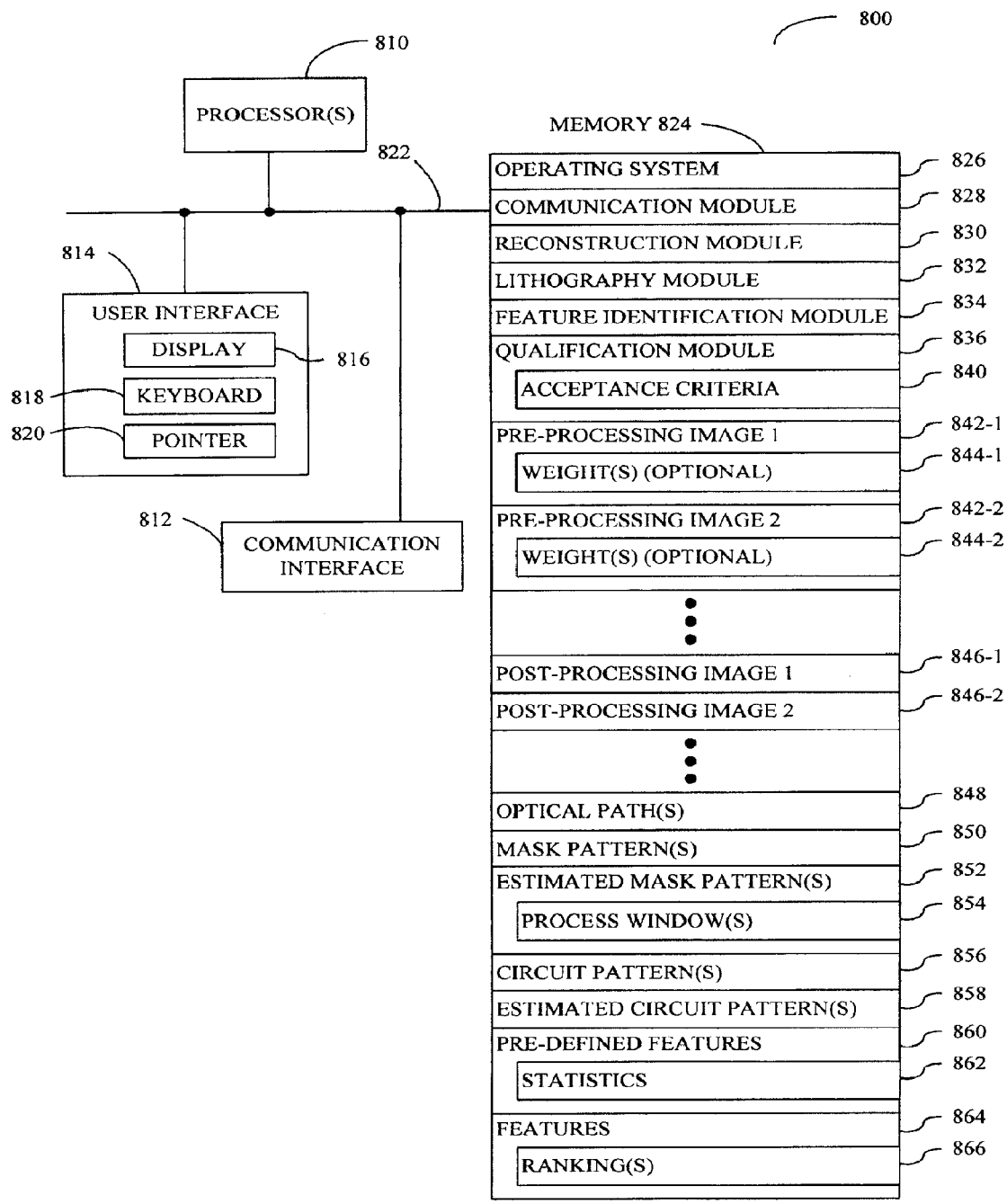
FIG. 8 is a block diagram illustrating a computer system in accordance with an) embodiment of the present invention.

We now discuss computer systems for implementing image reconstruction and photo-mask and/or patterned wafer qualification. FIG. 8 provides a block diagram illustrating a computer system 800 in accordance with an embodiment of the present invention. The computer system 800 includes one or more processors 810, a communication interface 812, a user interface 814, and one or more signal lines 822 coupling these components together. Note that the one or more processing units 810 may support parallel processing and/or multi-threaded operation, the communication interface 812 may have a persistent communication connection, and the one or more signal lines 822 may constitute a communication bus. Moreover, the user interface 814 may include a display 816, a keyboard 818, and/or a pointer 820, such as a mouse.

Memory 824 in the computer system 800 may include volatile memory and/or non-volatile memory. More specifically, memory 824 may include ROM, RAM, EPROM, EEPROM, FLASH, one or more smart cards, one or more magnetic disc storage devices, and/or one or more optical storage devices. Memory 824 may store an operating system 826 that includes procedures (or a set of instructions) for handling various basic system services for performing hardware dependent tasks. The memory 824 may also store procedures (or a set of instructions) in a communication module 828. The communication procedures may be used for communicating with one or more computers and/or servers, including computers and/or servers that are remotely located with respect to the computer system 800.

Memory 824 may also include multiple program modules (or a set of instructions), including a reconstruction module 830 (or a set of instructions) to determine reconstructed images, a lithography module 832 (or a set of instructions) to simulate a photo-lithographic process, a feature identification module 834 (or a set of instructions) to identify features 864 in reconstructed images, and/or a qualification module 836 (or a set of instructions) to determine an acceptance condition of one or more photo-masks and/or patterned wafers. The acceptance condition may be based on one or more acceptance criteria 840 (such as a number, type, and/or severity of defects corresponding to the features 864).

Furthermore, memory 824 may include pre-processing images 842 and post-processing images 846, i.e., images before and after reconstruction. The reconstruction module 830 and/or the lithography module 832 may utilize one or more stored models of optical paths 848 in photo-lithographic systems and/or optical-inspection devices. In some embodiments, the reconstruction module 830 may utilize optionally stored weights 844.

Memory 824 may include mask patterns 850 and/or circuit patterns 856 (i.e., target patterns). The reconstruction module 830 may utilize one or more of these patterns when reconstructing pre-processing images 842 corresponding to photo-masks and/or patterned wafers. In addition, memory 824 may include estimated mask patterns 852 and/or estimated circuit patterns 858. The lithography module 832 may utilize the estimated mask patterns 852 (which correspond to post-processing images 846) to determine the estimated circuit patterns 858.

Memory 824 may also include process window(s) 854 corresponding to the estimated mask patterns 852, pre-defined features 860, statistics 862 corresponding to these pre-defined features 860, and/or rankings 866 of the identified features 864. The qualification module 836 may determine the acceptance condition of one or more photo-masks and/or patterned wafers based on one or more of these items, as well as the features 864.

Instructions in the various modules in the memory 824 may be implemented in a high-level procedural language, an object-oriented programming language, and/or in an assembly or machine language. The programming language may be compiled or interpreted, i.e, configurable or configured to be executed by the one or more processing units 810.

In some embodiments, at least some of the information in memory 824 is encrypted. For example, the lithographic module 832 and/or its output files (the estimated circuit patterns 856) may be encrypted so that integrated-circuit manufacturers are more willing to share this information with photo-mask shops (where photo-mask inspection may be performed). As discussed in FIG. 9, in an alternate approach the photo-mask shop may send the photo-mask images (i.e., inspection images) to integrated-circuit manufacturers, who may perform wafer-pattern simulations for one or more devices and/or may determine photo-mask acceptance.

Although the computer system 800 is illustrated as having a number of discrete items, FIG. 8 is intended to be a functional description of the various features that may be present in the computer system 800 rather than as a structural schematic of the embodiments described herein. In practice, and as recognized by those of ordinary skill in the art, the functions of the computer system 800 may be distributed over a large number of servers or computers, with various groups of the servers or computers performing particular subsets of the functions. In some embodiments, some or all of the functionality of the computer system 800 may be implemented in one or more ASICs, one or more field programmable gate arrays (FGPGAs), and/or one or more digital signal processors (DSPs).

The computer system 800 may include fewer components or additional components, two or more components may be combined into a single component, and/or a position of one or more components may be changed. In some embodiments the functionality of the computer system 800 may be implemented more in hardware and less in software, or less in hardware and more in software, as is known in the art.

Figure 9:
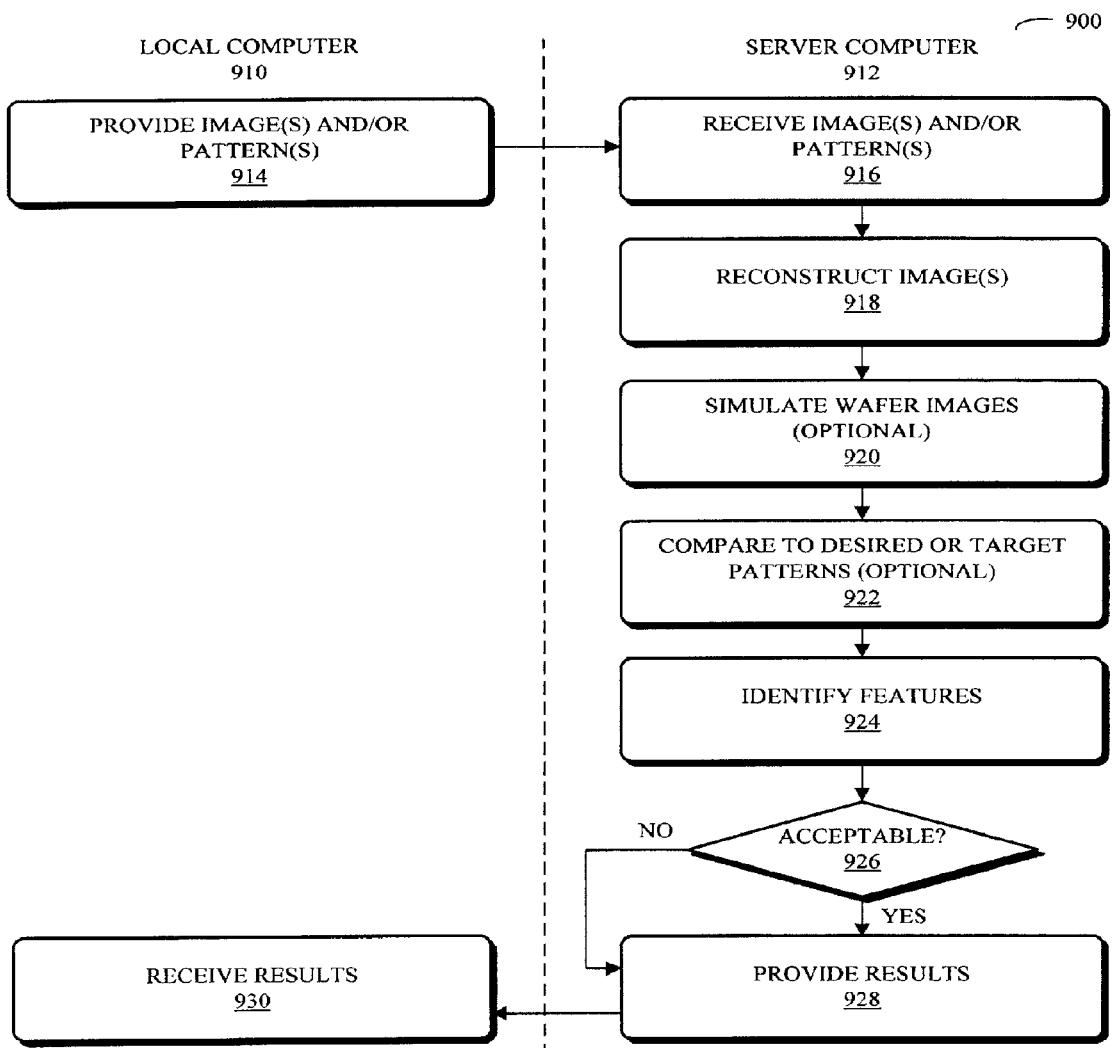
FIG. 9 is a flow chart illustrating a process for determining an image in accordance with an embodiment of the present invention.

As discussed previously, at least a portion of the image processing and inspection technique described may be implemented at a remote location. We now discuss such a method. FIG. 9 provides a flow chart illustrating a process 900 for determining an image in accordance with an embodiment of the present invention. During this process 900, a local computer 910) provides image(s) and/or pattern(s) (914), and a server computer 912 receives them (916). The system reconstructs the image(s) (918) based on the pattern(s) and image (s), and optionally simulates wafer images (920) and/or compares the image(s) to desired or target patterns (922). Furthermore, the system identifies features (924) and determines whether or not the photo-mask or patterned wafer is acceptable (926). Then the server computer 912 provides results (928) and the local computer 910 receives them (930).

Note that the information and files communicated between the local computer 910 and the server computer 912 are of a sensitive nature. As a consequence, in some embodiments a user of the local computer 910 may provide one or more security tokens, such as a PIN code, a user name, and/or a password, in order to use the image reconstruction and/or) lithography simulation programs or modules, as well as to access information stored on the server computer 912. In addition, in some embodiments the stored files or data structures, and/or data communicated over a network linking the local computer 910 and the server computer 912 are encrypted.

Also note that in some embodiments of the process 900 there may be additional or fewer operations, the order of the operations may be changed, and two or more operations may be combined into a single operation. For example, image reconstruction (918) and/or determination of the acceptance condition (926) may occur at the local computer 910.

The approach illustrated in the process 900 may allow photo-mask shops and integrated-circuit manufacturers to work together to determine whether or not a photo-mask is) acceptable, or should be reworked or rejected. Historically, both parties have had reservations about such an arrangement. Mask shops may be reluctant since it places the ability to reject a photo-mask in the hands of the end user (the integrated-circuit manufacturer), who may be cautious about accepting a photo-mask and may not have a financial motivation to accept a photo-mask that is less than optimal. In particular, since there is no cost to the end user, any potential defect may result in a photo-mask being rejected and the photo-mask shop may be forced to rewrite the photo-mask at their expense.

The approach described above may help resolve this conflict by creating a computational infrastructure that is agreed upon by both the photo-mask shop and the integrated-circuit manufacturer. In embodiments where photo-mask acceptance is fully automated, a system such as that illustrated by the server 910 may be installed at the integrated-circuit manufacturer and images sent by the photo-mask shop may be processed without exposing the details of the integrated-circuit manufacturing process to the photo-mask maker and yet at the same time without exposing the photo-mask shop to the human judgment of the integrated-circuit) manufacturer in accepting or rejecting photo-masks.

Alternatively, the photo-mask shop may calculate the reconstructed mask image based on the measurements from the photo-mask-inspection device. This reconstructed mask image may then be sent to the integrated-circuit manufacturer, where simulations of wafer patterns under various process conditions may be performed. The results may be sent back to the photo-mask shop, where they may be used to determine the disposition of defects (i.e., whether or not the photo-mask is acceptable). Therefore, the embodiments of the system and method described herein may be implemented by the photo-mask shop and/or by the integrated-circuit manufacturer.

We now discuss data structures that may be used in the computer system 800) (FIG. 8). FIG. 10 provides a block diagram illustrating an image data structure 1000 in accordance with an embodiment of the present invention. This data structure 1000 may include information corresponding to one or more images 1010. For a given image, such as the image 1010-1, the data structure 1000 may include a focal plane or focus condition 1012-1 at which the image was acquired, a wavelength at which the image was measured 1014-1, magnitude 1016-1 and/or phase 1018-1 information.

FIG. 11 provides a block diagram illustrating a feature data structure 1100 in accordance with an embodiment of the present invention. This data structure 1100 may include information corresponding to one or more pre-defined features 1110. For a given feature, such as the feature 1110-1, the data structure 1100 may include characteristics 1112-1 of the feature 1110-1 and/or an associated probability 1114-1 of occurrence. Note that that in some embodiments of the data structures 1000 and/or 1100 there may be fewer or additional components, two or more components may be combined into a single component, and/or a position of one or more components is changed. For example, data structure 1000 may include information about the type of illumination (such as disk, point, annulus, sigmas, etc.) and/or details of the optics (such as one or more wavelengths used or the numerical aperture).

While the preceding discussion has focused on techniques for inspecting photo-masks and/or patterned wafers, these techniques may also be used during metrology, such as process development, process characterization, and/or process monitoring. For example, a calculation (such as an inverse optical calculation) may be used to deconvolve the effect on an image of an optical path in a metrology device. Note that in some embodiments the optical path includes immersion optics. Thus, one or more of the techniques described previously may be used to enhance the resolution or recover additional information (such as spatial frequencies) in an image of a patterned wafer and/or a photo-mask.

Note that these techniques may allow faster, cheaper, and/ or non-destructive measurements. For example, critical dimensions (CDs) on a patterned wafer may be determined using an optical microscope (as opposed to a scanning electron microscope). These CDs may be used to calibrate design tools or modules (such as those for optical proximity correction) and/or manufacturing processes. Moreover, these image-processing techniques may be applied to measurements of isolated features (such as a line) and/or two-dimensional images.

In some embodiments, the image-processing techniques are used for disposition analysis and/or defect review during development (as opposed to the defect inspection and review embodiments described previously).

Moreover, while the preceding discussion has used patterned wafers and photo-masks as illustrative examples, the image-processing techniques may be used in a wide variety of imaging and/or measurement applications which are based on wave phenomena propagating in different types of media (such as electromagnetic waves and sound waves) and at different ranges of wavelengths (such as audio, radio, microwave, infrared, visible, ultra violet, and x-ray).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for determining an image, comprising:
receiving a mask pattern;
receiving a first image of at least a portion of a photo-mask corresponding to the mask pattern; and
using the computer, determining a second image of at least the portion of the photo-mask in accordance with the first image and the mask pattern, wherein the second image is characterized by additional spatial frequencies than the first image; and
wherein the mask pattern is characterized by spatial frequencies within a first band of frequencies, the first image is characterized by spatial frequencies within a second band of frequencies that is less than the first band of frequencies, and the second image is characterized by spatial frequencies within a third band of frequencies that is greater than the second band of frequencies.

2. The method of claim 1, wherein the third band of frequencies approximately includes the first band of frequencies.

3. The method of claim 1, further comprising identifying features in the second image corresponding to differences between at least the portion of the photo-mask and the mask pattern.

4. The method of claim 3, further comprising determining an acceptance condition of the photo-mask in accordance with at least a subset of the features.

5. The method of claim 4, wherein the acceptance condition is further in accordance with a number of the features in at least the subset of the features.

6. The method of claim 3, wherein at least a subset of the features is identified in accordance with an estimated pattern that results from a photolithographic process using an estimated photo-mask, and wherein the estimated photo-mask corresponds to the second image.

7. The method of claim 6, wherein the estimated pattern is calculated using a model of an optical path used in the photolithographic process.

8. The method of claim 7, wherein the model of the optical path includes a forward optical calculation in which the estimated photo-mask is included in an object plane to determine the estimated pattern.

9. The method of claim 6, wherein the estimated pattern is calculated using a model of a photoresist used in the photolithographic process.

10. The method of claim 6, wherein at least the subset of the features is further identified in accordance with differences between the estimated pattern and a target pattern, wherein the target pattern corresponds to at least a portion of an integrated circuit.

11. The method of claim 10, wherein the target pattern corresponds to a document that is compatible with GDSII or OASIS format.

12. The method of claim 3, wherein an acceptance condition of the photo-mask is determined in accordance with a process window corresponding to an estimated photo-mask, wherein the estimated photo-mask corresponds to the second image.

13. The method of claim 3, further comprising providing a ranking of at least a subset of the features.

14. The method of claim 3, wherein at least a subset of the features correspond to defects in the photo-mask.

15. The method of claim 3, wherein at least the subset of the features is identified in accordance with a set of pre-determined features.

16. The method of claim 15, wherein at least the subset of the features is identified in accordance with statistical properties of the set of pre-determined features.

17. The method of claim 3, further comprising iteratively performing the operations of determining and identifying, wherein at least the subset of the features identified have a likelihood of occurrence exceeding a pre-determined value.

18. The method of claim 1, wherein the second image is determined using an inverse optical calculation in which the first image is in an image plane of a model of an optical path that corresponds to an optical inspection device used to generate the first image and the second image is in an object plane of the model of the optical path.

19. The method of claim 1, wherein the second image is further determined in accordance with a third image of the photo-mask, and wherein the first image and the third image correspond to different imaging conditions in an optical inspection device.

20. The method of claim 19, wherein the second image is further determined in accordance with weights for the respective images.

21. The method of claim 1, wherein the determining of the second image is further in accordance with a model of an optical path in an optical inspection device.

22. The method of claim 1, wherein a respective image includes magnitude and phase information.

23. A computer-program product for use in conjunction with a computer system, the computer-program product comprising a non-transitory, computer-readable storage medium and a computer-program mechanism embedded therein for determining a mask pattern, the computer-program mechanism including:
instructions for receiving a mask pattern;
instructions for receiving a first image of at least a portion of a photo-mask corresponding to the mask pattern; and
instructions for determining a second image of at least the portion of the photo-mask in accordance with the first image and the mask pattern, wherein the second image is characterized by additional spatial frequencies than the first image; and
wherein the mask pattern is characterized by spatial frequencies within a first band of frequencies, the first image is characterized by spatial frequencies within a second band of frequencies that is less than the first band of frequencies, and the second image is characterized by spatial frequencies within a third band of frequencies that is greater than the second band of frequencies.

24. A computer-implemented method for determining an image, comprising:
receiving a mask pattern;
receiving a first image of at least a portion of a photo-mask corresponding to the mask pattern; and
using the computer, determining a second image of at least the portion of the photo-mask in accordance with the first image and the mask pattern, wherein the second image is determined in an optical calculation using a model of an optical path corresponding to an optical inspection device; and wherein the mask pattern is characterized by spatial frequencies within a first band of frequencies, the first image is characterized by spatial frequencies within a second band of frequencies that is less than the first band of frequencies, and the second image is characterized by spatial frequencies within a third band of frequencies that is greater than the second band of frequencies.

25. The method of claim 24, wherein the determining includes an iterative optical calculation.

26. The method of claim 24, wherein the determining is in accordance with a gradient descent calculation.

27. A computer-implemented method for determining an image, comprising:

receiving a target pattern;

receiving a first image of at least a portion of a patterned wafer corresponding to the target pattern; and using the computer, determining a second image of at least the portion of the patterned wafer in accordance with the first image and the target pattern, wherein the second image is characterized by additional spatial frequencies than the first image; and wherein the target pattern is characterized by spatial frequencies within a first band of frequencies, the first image is characterized by spatial frequencies within a second band of frequencies that is less than the first band of frequencies, and the second image is characterized by spatial frequencies within a third band of frequencies that is greater than the second band of frequencies.

28. A computer system, comprising:

at least one processor;

at least one memory; and at least one program module, the program module stored in the memory and configured to be executed by the processor, the program module including:

instructions for receiving a mask pattern;

instructions for receiving a first image of at least a portion of a photo-mask corresponding to the mask pattern; and instructions for determining a second image of at least the portion of the photo-mask in accordance with the first image and the mask pattern, wherein the second image is characterized by additional spatial frequencies than the first image; and wherein the mask pattern is characterized by spatial frequencies within a first band of frequencies, the first image is characterized by spatial frequencies within a second band of frequencies that is less than the first band of frequencies, and the second image is characterized by spatial frequencies within a third band of frequencies that is greater than the second band of frequencies.

29. A computer system, comprising:

means for computing;

means for storing; and at least one program module mechanism, the program module mechanism stored in at least the means for storing and configured to be executed by at least the means for computing, at least the program module mechanism including:

instructions for receiving a mask pattern;

instructions for receiving a first image of at least a portion of a photo-mask corresponding to the mask pattern; and instructions for determining a second image of at least the portion of the photo-mask in accordance with the first image and the mask pattern, wherein the second image is characterized by additional spatial frequencies than the first image; and wherein the mask pattern is characterized by spatial frequencies within a first band of frequencies, the first image is characterized by spatial frequencies within a second band of frequencies that is less than the first band of frequencies, and the second image is characterized by spatial frequencies within a third band of frequencies that is greater than the second band of frequencies.

* * * * *